United States Patent
Singh et al.

(10) Patent No.: US 12,136,920 B2
(45) Date of Patent: Nov. 5, 2024

(54) CURRENT-MODE RADIO FREQUENCY ATTENUATORS

(71) Applicant: QUALCOMM Incorporated, San Diego, CA (US)

(72) Inventors: Rahul Singh, San Diego, CA (US); Mehran Bakhshiani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 438 days.

(21) Appl. No.: 17/652,961

(22) Filed: Mar. 1, 2022

(65) Prior Publication Data
US 2023/0283268 A1 Sep. 7, 2023

(51) Int. Cl.
*H01P 1/22* (2006.01)
*H03F 3/19* (2006.01)
*H03K 5/01* (2006.01)

(52) U.S. Cl.
CPC .......... *H03K 5/01* (2013.01); *H03F 3/19* (2013.01); *H03F 2200/294* (2013.01); *H03F 2200/451* (2013.01)

(58) Field of Classification Search
CPC ....... H03K 5/01; H03F 3/19; H03F 2200/451; H03F 2200/294
See application file for complete search history.

(56) References Cited

U.S. PATENT DOCUMENTS 3,668,693 A * 6/1972 Eaton ............... H03K 7/06
 341/116
3,859,609 A * 1/1975 Couvillon ........... H01P 1/22
 327/310

(Continued)

FOREIGN PATENT DOCUMENTS

EP 210783 A * 2/1987 ........... H03H 7/25
EP 0210783 A2 2/1987

OTHER PUBLICATIONS

Alzaher, H.A., et al., "Digitally Tuned Analog Integrated Filters Using the R-2R Ladder", ICECS 2000, 7th IEEE International Conference on Electronics, Circuits and Systems, Dec. 17-20, 2000, pp. 383-385.

(Continued)

*Primary Examiner* — Hai V Nguyen
(74) *Attorney, Agent, or Firm* — Loza & Loza

(57) ABSTRACT

Attenuators are disclosed according to various aspects. In some aspects, an attenuator includes resistors coupled along a resistive path, wherein a first one of the resistors is coupled to an input of the attenuator, and shunt circuits, wherein each one of the shunt circuits is coupled between a respective node on the resistive path and an output of the attenuator. In other aspects, an attenuator includes routing circuits coupled in parallel between an input of the attenuator and an output of the attenuator, wherein each one of the routing circuits includes a respective series resistor and a respective series switch coupled in series between the input of the attenuator and the output of the attenuator, and a respective switchable resistor circuit coupled to a respective node between the respective series resistor and the respective series switch, wherein resistances of the series resistors of the routing circuits are binary weighted.

25 Claims, 12 Drawing Sheets

(56) References Cited

U.S. PATENT DOCUMENTS

| | | | | |
|---|---|---|---|---|
| 4,654,610 | A * | 3/1987 | Dasilva | H03H 7/255 323/354 |
| 5,648,740 | A * | 7/1997 | Devlin | H03H 11/245 327/408 |
| 6,122,302 | A * | 9/2000 | Dean | H04B 10/503 398/1 |
| 6,667,669 | B2 * | 12/2003 | Goyette | H03G 1/0058 327/306 |
| 6,680,640 | B1 * | 1/2004 | Behzad | H03G 3/3036 333/81 R |
| 6,696,892 | B1 * | 2/2004 | Behzad | H03G 3/001 330/134 |
| 6,731,160 | B1 * | 5/2004 | Behzad | H03G 3/3036 327/552 |
| 7,081,790 | B2 * | 7/2006 | Behzad | H03G 5/10 327/552 |
| 7,196,566 | B2 * | 3/2007 | Kaiser, Jr. | H03H 11/245 333/81 R |
| 7,313,367 | B2 * | 12/2007 | Bialek | H04B 1/44 455/73 |
| 7,660,571 | B2 * | 2/2010 | Chang | H03G 1/0088 333/81 R |
| 7,675,380 | B2 * | 3/2010 | Chiu | H03H 7/24 333/81 R |
| 8,076,995 | B2 * | 12/2011 | Chiu | H03H 7/24 333/81 R |
| 8,143,969 | B2 * | 3/2012 | Das | H01P 1/22 333/81 R |
| 8,385,867 | B2 * | 2/2013 | Rafi | H03J 3/32 455/150.1 |
| 8,536,945 | B2 * | 9/2013 | Hoogzaad | H03F 3/45089 330/252 |
| 8,842,399 | B2 * | 9/2014 | Jones | H03F 3/245 361/111 |
| 9,531,359 | B1 * | 12/2016 | Shrivastava | H03H 11/245 |
| 9,817,513 | B2 * | 11/2017 | Yao | G06F 3/0443 |
| 9,871,530 | B1 * | 1/2018 | La Grou | H03M 1/68 |
| 10,003,322 | B2 * | 6/2018 | Lam | H03H 7/251 |
| 10,033,340 | B1 * | 7/2018 | Hanafi | H03F 3/21 |
| 10,382,003 | B2 | 8/2019 | Bergsma | |
| 10,886,588 | B2 * | 1/2021 | Lujan | H03F 3/45475 |
| 11,277,109 | B1 * | 3/2022 | Golat | H03F 3/19 |
| 11,405,064 | B1 * | 8/2022 | Kovac | H04B 1/18 |
| 11,550,354 | B2 * | 1/2023 | Chen | H03L 7/0998 |
| 11,936,346 | B2 * | 3/2024 | Sharma | H03F 3/45475 |
| 2003/0184461 | A1 * | 10/2003 | Goyette | H03G 1/0058 341/139 |
| 2005/0093606 | A1 * | 5/2005 | Kaiser | H03H 11/245 327/308 |
| 2005/0110543 | A1 * | 5/2005 | Touya | H01L 23/5222 327/165 |
| 2005/0162220 | A1 * | 7/2005 | Behzad | H03H 11/245 327/559 |
| 2005/0245201 | A1 * | 11/2005 | Ella | H04B 1/406 455/272 |
| 2006/0035611 | A1 * | 2/2006 | Connell | H03D 7/1441 455/209 |
| 2007/0105517 | A1 * | 5/2007 | Chang | H03G 1/0088 455/12.1 |
| 2008/0233913 | A1 * | 9/2008 | Sivasubramaniam | H04B 1/18 455/232.1 |
| 2008/0265910 | A1 * | 10/2008 | Gasperi | G01R 27/04 324/629 |
| 2009/0072931 | A1 * | 3/2009 | Chiu | H03H 7/24 333/81 R |
| 2010/0164656 | A1 * | 7/2010 | Chiu | H03H 7/24 333/81 R |
| 2011/0084784 | A1 * | 4/2011 | Das | H01P 1/22 333/81 A |
| 2011/0273248 | A1 * | 11/2011 | Nicolson | H03H 7/25 333/81 A |
| 2012/0262235 | A1 * | 10/2012 | Hoogzaad | H03F 3/45089 330/252 |
| 2014/0306737 | A1 * | 10/2014 | Mukherjee | H03F 1/08 327/108 |
| 2015/0035595 | A1 * | 2/2015 | Harwalkar | H04B 1/18 330/185 |
| 2015/0111514 | A1 * | 4/2015 | Harwalkar | H04B 1/18 455/252.1 |
| 2015/0303954 | A1 * | 10/2015 | Guermandi | H03G 1/0088 455/296 |
| 2016/0216836 | A1 * | 7/2016 | Yao | G06F 3/041661 |
| 2017/0104471 | A1 * | 4/2017 | Shrivastava | H03H 7/25 |
| 2017/0104574 | A1 * | 4/2017 | Hahn | H04L 5/14 |
| 2018/0054178 | A1 * | 2/2018 | Bergsma | H03H 7/07 |
| 2018/0062622 | A1 * | 3/2018 | Yan | H03H 7/25 |
| 2018/0102763 | A1 * | 4/2018 | Lam | H03H 11/245 |
| 2018/0138874 | A1 * | 5/2018 | Bergsma | H03F 3/21 |
| 2018/0138877 | A1 * | 5/2018 | Bergsma | H03G 3/20 |
| 2018/0152158 | A1 * | 5/2018 | Ayraud | H03F 3/191 |
| 2018/0198428 | A1 * | 7/2018 | Hanafi | H03F 3/245 |
| 2019/0268029 | A1 * | 8/2019 | Hahn | H04B 1/40 |
| 2020/0403581 | A1 * | 12/2020 | Tokuda | H03F 1/56 |
| 2022/0070997 | A1 * | 3/2022 | Clark | H01P 3/08 |
| 2023/0069891 | A1 * | 3/2023 | Ramkaj | H04B 1/1638 |
| 2023/0253990 | A1 * | 8/2023 | Singh | H03F 3/19 455/552.1 |

OTHER PUBLICATIONS

Mclaurin, D.J., et al., "A Highly Reconfigurable 65nm CMOS RF-to-Bits Transceiver for Full-Band Multicarrier TDD/FDD 2G/3G/4G/5G Macro Basestations", IEEE International Solid—State Circuits Conference—(ISSCC), Session 9, Wireless Transceivers and Techniques, 9.3, Feb. 11-15, 2018, pp. 161-163.

Razavi, B., "The R-2R and C-2C Ladders", IEEE Solid-State Circuits Magazine, vol. 11, No. 3, Aug. 23, 2019, pp. 10-15.

International Search Report and Written Opinion—PCT/US2023/062096—ISA/EPO—May 22, 2023.

* cited by examiner

CURRENT-MODE RADIO FREQUENCY ATTENUATORS

BACKGROUND

Field

Aspects of the present disclosure relate generally to wireless communications, and more particularly, to attenuators.

Background

A wireless device (e.g., smart phone) may transmit and receive radio frequency (RF) signals in one or more wireless networks (e.g., long-term evolution (LTE) network, fifth generation (5G) network, wireless local area network (WLAN), etc.). To receive RF signals of varying signal strength, the wireless device may include one or more attenuators to control the signal strength of the received RF signals and prevent saturation of circuits (e.g., low-noise amplifier, mixer, etc.) in the receiver. An attenuator may also be used in a receiver coupled to a power amplifier in a pre-distortion or correction loop, in which case the attenuator may need to have high power-handling capability.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to an attenuator. The attenuator includes resistors coupled along a resistive path, wherein a first one of the resistors is coupled to an input of the attenuator, and shunt circuits, wherein each one of the shunt circuits is coupled between a respective node on the resistive path and an output of the attenuator. Each one of the shunt circuits includes a respective shunt resistor and a respective shunt switch coupled in series between the respective node on the resistive path and the output of the attenuator, and a respective switchable resistor circuit coupled to a respective node between the respective shunt resistor and the respective shunt switch.

A second aspect relates to an attenuator. The attenuator includes routing circuits coupled in parallel between an input of the attenuator and an output of the attenuator. Each one of the routing circuits includes a respective series resistor and a respective series switch coupled in series between the input of the attenuator and the output of the attenuator, and a respective switchable resistor circuit coupled to a respective node between the respective series resistor and the respective series switch. The resistances of the series resistors of the routing circuits are binary weighted.

A third aspect relates to a system. The system includes a first attenuator having an input and an output. The first attenuator includes resistors coupled along a resistive path, wherein a first one of the resistors is coupled to the input of the first attenuator, and shunt circuits, wherein each one of the shunt circuits is coupled between a respective node on the resistive path and the output of the first attenuator. Each one of the shunt circuits includes a respective shunt resistor and a respective shunt switch coupled in series between the respective node on the resistive path and the output of the first attenuator, and a respective switchable resistor circuit coupled to a respective node between the respective shunt resistor and the respective shunt switch. The system also includes a second attenuator having an input and an output, wherein the input of the second attenuator is coupled to the output of the first attenuator.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A wireless device (e.g., smart phone) may transmit and receive RF signals in one or more wireless networks (e.g., LTE network, 5G network, WLAN, etc.). To receive RF signals, the wireless device includes one or more antennas and a receiver coupled to the one or more antennas. The wireless device may also be configured to receive RF signals with different signal strengths. This may occur, for example, when the RF signals are transmitted from transmitters at different distances from the wireless device and/or from transmitters having different transmit powers.

Figure 1:
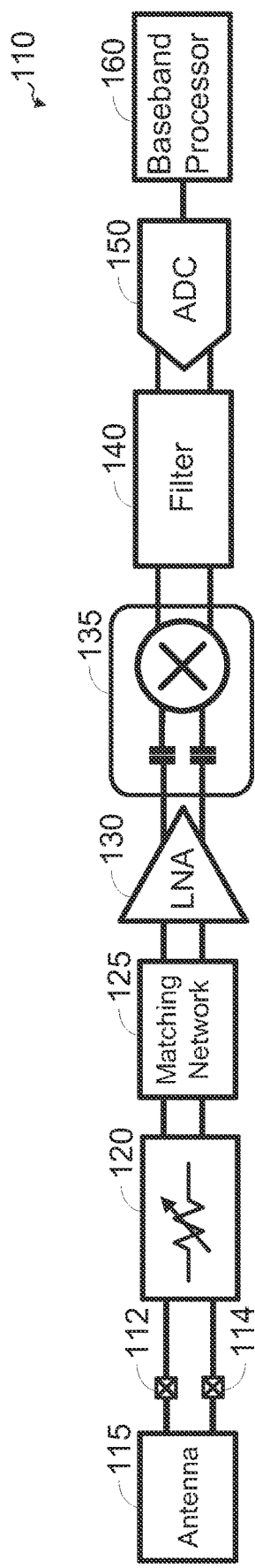
FIG. 1 shows an example of a receiver including an attenuator according to certain aspects of the present disclosure.

To receive RF signals of varying signal strength, the wireless device may include one or more attenuators to control the signal strength of received RF signals and prevent saturation of circuits (e.g., low-noise amplifier, mixer, etc.) in the receiver. In this regard, FIG. 1 shows an example of a receiver 110 including an attenuator 120, a matching network 125, a low-noise amplifier (LNA) 130, a mixer 135, a filter 140, and an analog-to-digital converter (ADC) 150. Each of these circuits may be single-ended or differential.

The receiver 110 may be coupled to an antenna 115 configured to receive an RF signal (e.g., from a base station, a wireless access point, another wireless device, etc.). In one example, the receiver 110 may be integrated on a chip and coupled to the antenna 115 (e.g., off-chip antenna) via receive pins 112 and 114. The RF signal may be a differential signal or a single-ended signal. In certain aspects, the receive pins 112 and 114 may be coupled to the antenna 115 via a transformer (not shown) configured to convert a singled-ended RF signal from the antenna 115 into a differential RF signal at the receive pins 112 and 114. The antenna 115 may be single-ended or differential.

In the example shown in FIG. 1, the input of the attenuator 120 is coupled to the antenna 115 via the receive pins 112 and 114. The attenuator 120 is configured to control the signal strength of a received RF signal by attenuating the received RF signal by an adjustable attenuation level, as discussed further below. The matching network 125 is coupled between the output of the attenuator 120 and the input of the LNA 130. The matching network 125 is configured to provide impedance matching between the output of the attenuator 120 and the input of the LNA 130. The input of the mixer 135 is coupled to the output of the LNA 130. The mixer 135 is configured to mix the RF signal with a local oscillator signal to frequency downconvert the RF signal to a baseband signal or an intermediate frequency (IF) signal. The filter 140 is coupled between the output of the mixer 135 and the ADC 150. The filter 140 may be configured to filter the baseband signal or the IF signal. The ADC 150 is configured to convert the baseband signal or the IF signal into a digital signal for further processing. In the example in FIG. 1, the output of the ADC 150 is coupled to a baseband processor 160. The baseband processor 160 may be configured to process the digital signal from the ADC 150 to recover data and/or control information from the digital signal. The processing by the baseband processor 160 may include demodulation, decoding, and the like. It is to be appreciated that the receiver 110 may include additional components not shown in FIG. 1 such as another mixer, an amplifier, a current-to-voltage converter, another filter (e.g., between the antenna 115 and the LNA 130), etc.

In this example, the attenuator 120 allows the receiver 110 to receive RF signals of varying strength without saturating the LNA 130. For example, the attenuation level of the attenuator 120 may be set based on the detected signal strength of a received RF signal. In this example, the attenuation level may be set higher for a higher signal strength to prevent saturation of the LNA 130, and may be set lower for a lower signal strength. For a very low strength RF signal, the attenuator 120 may pass the RF signal to the LNA 130 with no attenuation.

Figure 2:
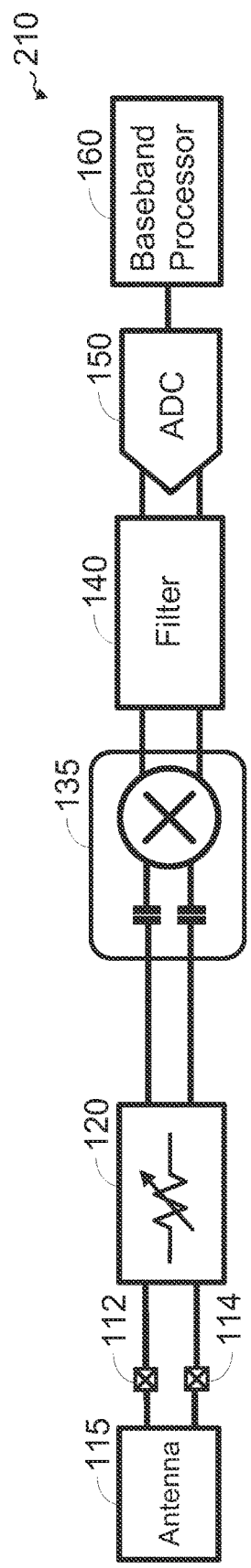
FIG. 2 shows another example of a receiver including an attenuator according to certain aspects of the present disclosure.

FIG. 2 shows another example of a receiver 210 including the attenuator 120, the mixer 135, the filter 140, and the analog-to-digital converter (ADC) 150. In this example, the LNA 130 shown in FIG. 1 is omitted with the output of the attenuator 120 coupled to the input of the mixer 135. In this example, the attenuator 120 may attenuate a received RF signal having a high signal strength to prevent the RF signal from saturating the mixer 135. It is to be appreciated that the receiver 210 may include additional components not shown in FIG. 2 such as another mixer, an amplifier, a current-to-voltage converter, another filter, etc.

Thus, the attenuator 120 may be used in a receiver to attenuate RF signals by an adjustable attenuation level to prevent the RF signals from saturating one or more circuits (e.g., LNA 130 and/or mixer 135) in the receiver. Although the attenuator 120 is discussed above using the exemplary receivers 110 and 210 shown in FIGS. 1 and 2, it is to be appreciated that the attenuator 120 may be used in other receiver architectures to controllably attenuate RF signals. The attenuator 120 may also be used in a receiver coupled to a power amplifier in a pre-distortion or correction loop, in which case the attenuator 120 may need to have high power-handling capability. The attenuator 120 may also be used in any other circuitry where attenuation of a signal is desirable. For example, the attenuator 120 may be used in a receiver to controllably attenuate a signal received from a transmission line (e.g., coaxial cable). In another example, the attenuator 120 may be used in an audio system to controllably attenuate an audio signal for volume control.

For applications requiring high dynamic range, it is desirable that the attenuator 120 be capable of attenuating RF signals at high attenuation levels (e.g., as high as 25 dB) to sufficiently attenuate RF signals having high signal strengths. In these applications, it is desirable for the attenuator 120 to maintain high linearity even at high attenuation levels.

Further, it may be desirable for the attenuator 120 to provide fine-grained control of the attenuation level to finely optimize the receive path signal-to-noise ratio (SNR) for different levels of received signal strength and different bandwidth modes.

Further, for applications where the receiver receives RF signals over a wide frequency band, it is desirable that the attenuator 120 achieve consistent performance (e.g., attenuation level and/or frequency response) over the wide frequency band (e.g., wide frequency band covering 2G/3G/4G/5G bands).

Figure 3A:
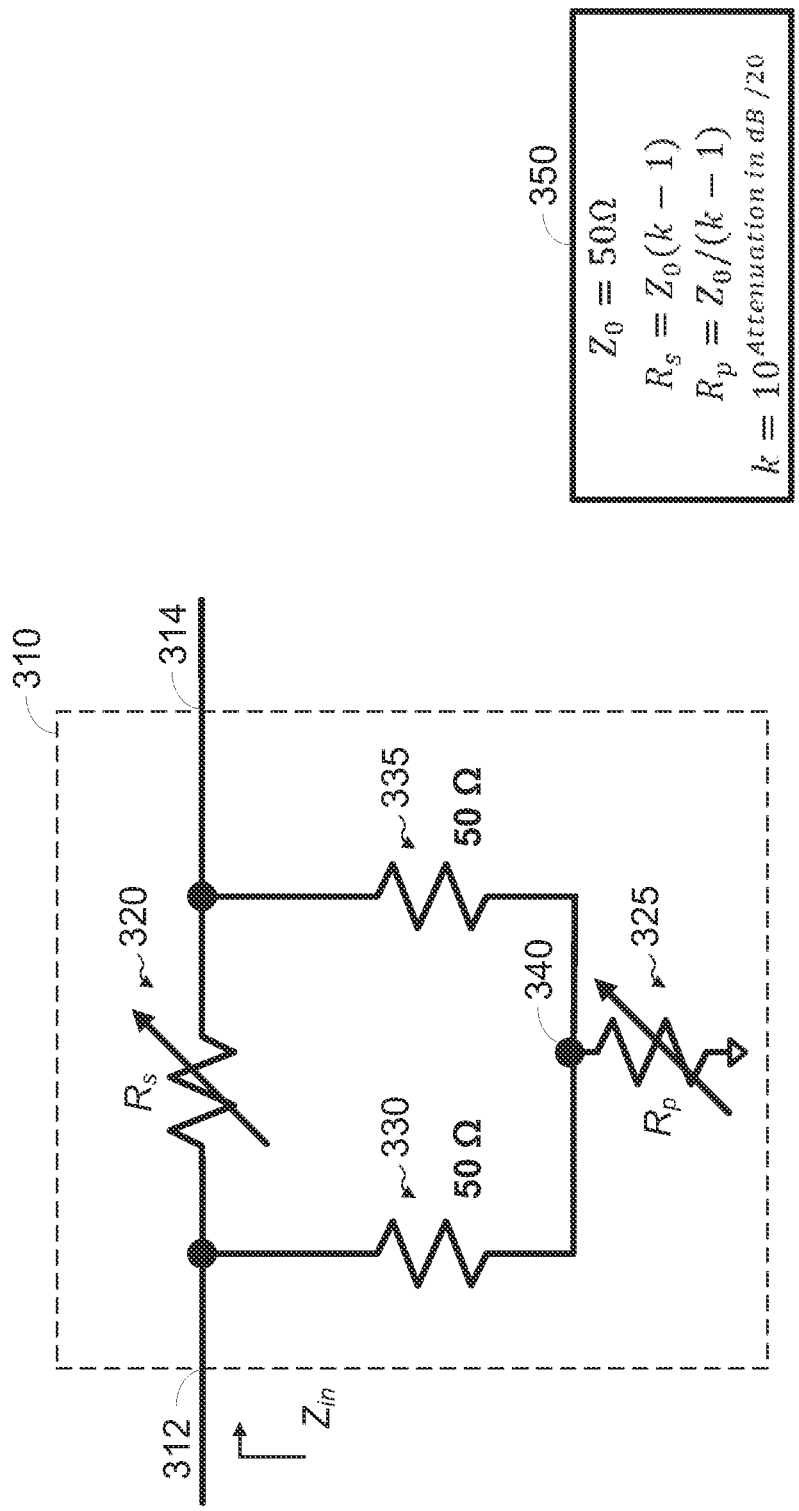
FIG. 3A shows an example of a bridged-T attenuator according to certain aspects of the present disclosure.

FIG. 3A shows an example of a bridged-T attenuator 310 including a first resistor 320, a second resistor 325, a third resistor 330, and a fourth resistor 335. The first resistor 320 is coupled between the input 312 and the output 314 of the bridged-T attenuator 310, the third resistor 330 is coupled between the input 312 of the bridged-T attenuator 310 and a node 340, the fourth resistor 335 is coupled between the output 314 of the bridged-T attenuator 310 and the node 340, and the second resistor 325 is coupled between the node 340 and ground.

The first resistor 320 is a variable resistor having an adjustable resistance Rs and the second resistor 325 is a variable resistor having an adjustable resistance Rp. Each one of the third resistor 330 and the fourth resistor 335 may have a fixed resistance (e.g., 50 ohms for an input impedance of 50 ohms). In this example, the attenuation level of the bridged-T attenuator 310 is adjusted by adjusting the resistance Rs of the first resistor 320 and the resistance Rp of the second resistor 325. In FIG. 3A, the relationship between the resistances Rs and Rp and the attenuation level of the bridged-T attenuator 310 is shown in the box 350.

Figure 3B:
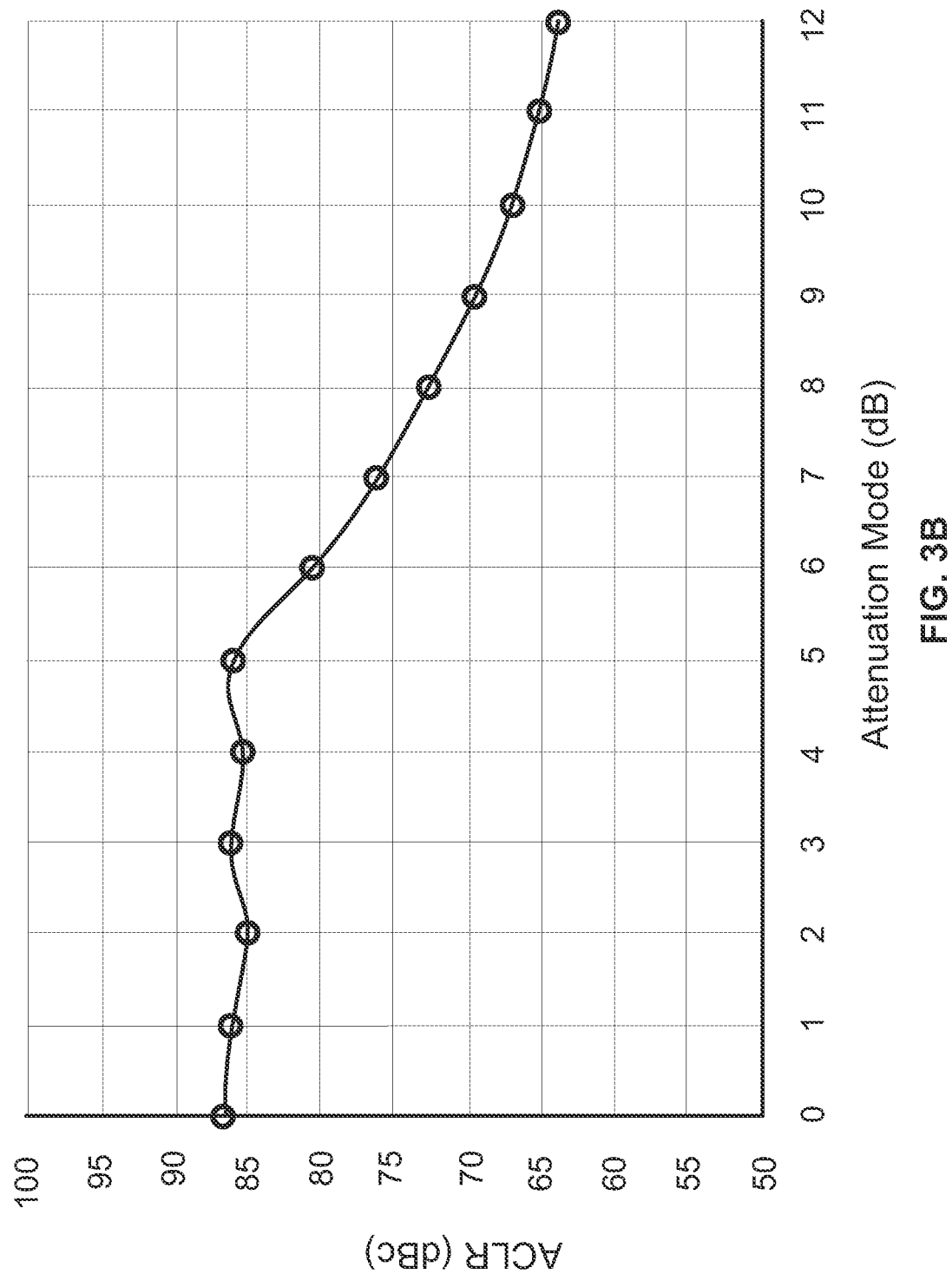
FIG. 3B shows an example of a plot of linearity versus attenuation level for the exemplary bridged-T attenuator in FIG. 3A according to certain aspects of the present disclosure.

The bridged-T attenuator 310 generally provides a constant input impedance (e.g., to provide impedance matching with an antenna and/or transmission line coupled to the input 312). However, increasing the attenuation level of the bridged-T attenuator 310 rapidly degrades the linearity of the bridged-T attenuator 310 as well as affect the wideband performance (also referred to as broadband performance) of the bridged-T attenuator 310. In this regard, FIG. 3B shows an exemplary plot of adjacent channel leakage ratio (ACLR) as a measure of linearity versus attenuation level for the bridged-T attenuator 310. As shown in FIG. 3B, the linearity rapidly degrades with attenuation levels above 6 dB.

The degradation in linearity is caused by large voltage drops across active devices (e.g., transistors) in the resistors 320 and 325 as the attenuation level of the bridged-T attenuator increases. The large voltage drops across the active devices cause the active devices to become non-linear which degrades the linearity of the bridged-T attenuator 310.

Figure 4A:
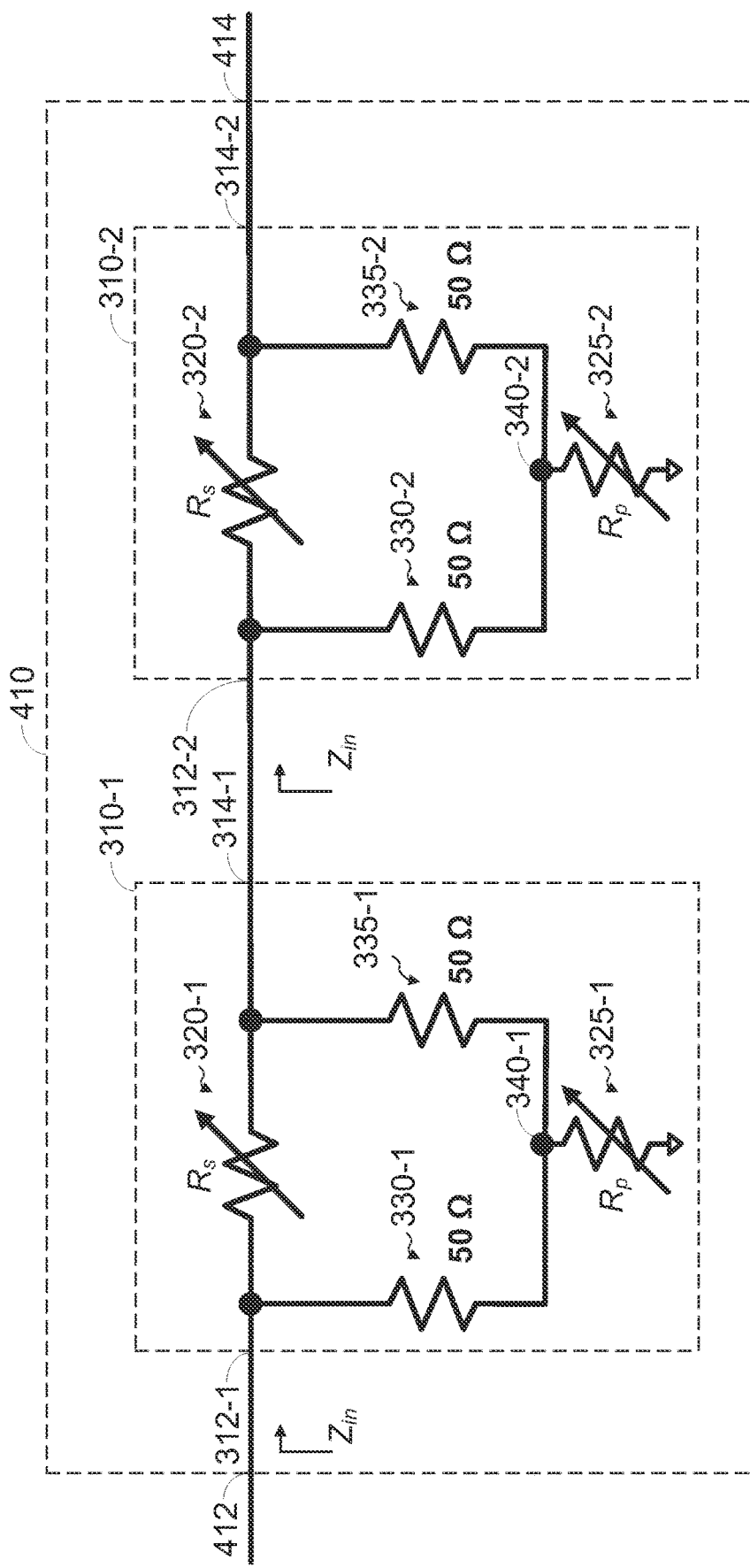
FIG. 4A shows an example of a cascade bridged-T attenuator according to certain aspects of the present disclosure.

Two or more bridged-T attenuators may be cascaded to form a cascade bridged-T attenuator. In this regard, FIG. 4A shows an example of a cascade bridged-T attenuator 410 including a first bridged-T attenuator 310-1 and a second bridged-T attenuator 310-2. In this example, each of the first bridged-T attenuator 310-1 and the second bridged-T attenuator 310-2 may be a separate instance of the bridged-T attenuator 310 shown in FIG. 3A. In FIG. 4A, the number "1" is appended to the reference numbers for the first bridged-T attenuator 310-1 are the number "2" is appended to the reference numbers for the second bridged-T attenuator 310-2.

In this example, the first bridged-T attenuator 310-1 and the second bridged-T attenuator 310-2 are cascaded by coupling the output 314-1 of the first bridged-T attenuator 310-1 to the input 312-2 of the second bridged-T attenuator 310-2. The input 412 of the cascade bridged-T attenuator 410 is taken at the input 312-1 of the first bridged-T attenuator 310-1 and the output 414 of the cascade bridged-T attenuator 410 is taken at the output 314-2 of the second bridged-T attenuator 310-2.

Figure 4B:
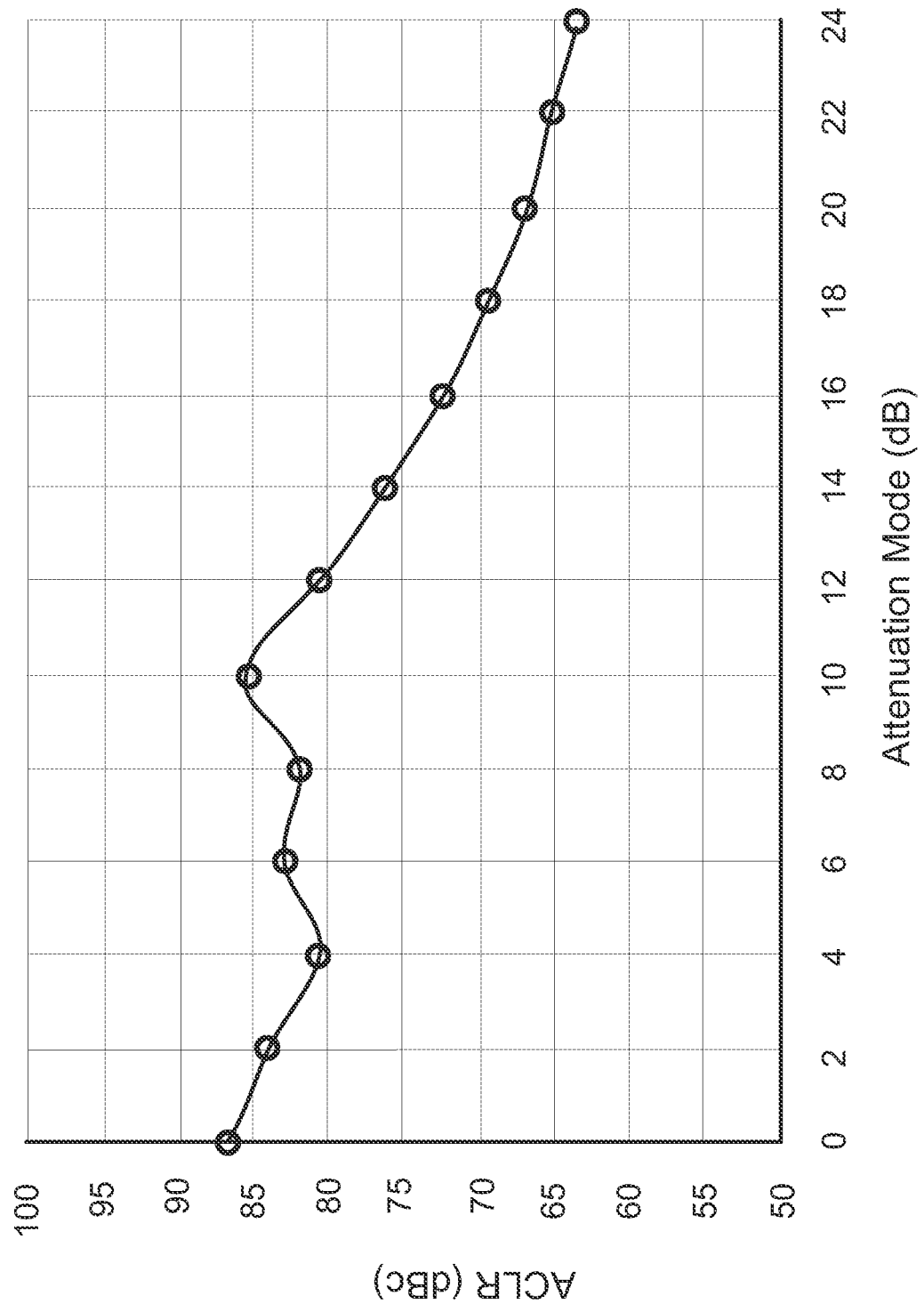
FIG. 4B shows an example of a plot of linearity versus attenuation level for the exemplary cascade bridged-T attenuator in FIG. 4A according to certain aspects of the present disclosure.

Cascading the first bridged-T attenuator 310-1 and the second bridged-T attenuator 310-2 allows higher attenuation levels compared with the single bridged-T attenuator 310. However, the cascade bridged-T attenuator 410 also suffers from rapid degradation in linearity at high attenuation levels. In this regard, FIG. 4B shows an exemplary plot of ACLR as a measure of linearity versus attenuation level for the cascade bridged-T attenuator 410. As shown in FIG. 4B, the linearity rapidly degrades with attenuation levels above 12 dB. Thus, the cascade bridged-T attenuator 410 encounters similar linearity degradation as the single bridged-T attenuator 310.

Accordingly, an attenuator having a high dynamic range with high linearity at high attenuation levels is desirable.

Also, for applications where the receiver receives RF signals over a wide frequency band, it is desirable that the attenuator achieve consistent performance (e.g., attenuation level and/or frequency response) over the wide frequency band (e.g., wide frequency band to cover the 2G/3G/4G/5G bands).

To address the above, aspects of the present disclosure provide current-mode attenuators with wide dynamic range and high linearity over a wide attenuation range compared with other attenuators (e.g., bridged-T attenuators, T attenuators, resistor-divider attenuators, etc.), as discussed further below. As used herein, a "current-mode attenuator" refers to an attenuator configured to attenuate a signal via current splitting and/or current redirection. The attenuation of a current-mode attenuator may be defined by the ratio $i_{OUT}/i_{RF}$, where $i_{OUT}$ is the current flowing out of the output of the attenuator and $i_{RF}$ is the current flowing into the input of the attenuator. The smaller the ratio $i_{OUT}/i_{RF}$, the higher the attenuation. The attenuation may also be given in dB by computing $20*LOG_{10}(i_{OUT}/i_{RF})$.

Current-mode attenuators according to aspects of the present disclosure provide an approximately constant desired input impedance (e.g., 50Ω single-ended, and 100Ω differential) irrespective of attenuation level while interfacing with the input impedance of a subsequent block (e.g., LNA 130 and matching network 125, mixer 135, etc.).

Figure 5:
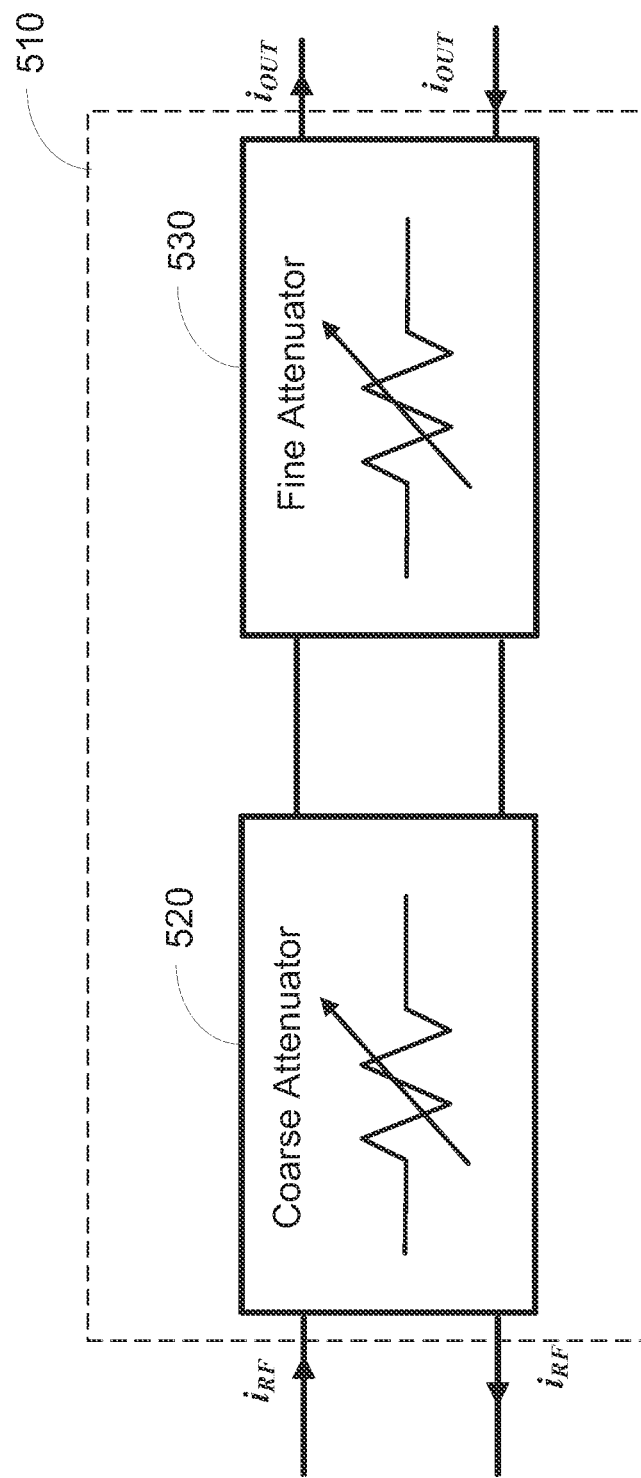
FIG. 5 shows an example of an attenuator including a coarse attenuator and a fine attenuator according to certain aspects of the present disclosure.

To support wide attenuation levels and hence wide receiver dynamic range, an attenuator according to aspects of the present disclosure may include a coarse attenuator and a fine attenuator. In this regard, FIG. 5 shows an example of an attenuator 510 including a coarse attenuator 520 and a fine attenuator 530 in which the fine attenuator 530 is cascaded with the coarse attenuator 520. In this example, the attenuation level of the coarse attenuator 520 may be adjusted in coarse attenuation steps (e.g., attenuation steps of approximately 6 dB) and the attenuation level of the fine attenuator 530 may be adjusted in fine attenuation steps (e.g., attenuation steps of approximately 1 dB). In other words, the attenuation steps of the coarse attenuator 520 are larger than the attenuation steps of the fine attenuator 530. Together, the coarse attenuator 520 and the fine attenuator 530 allow the attenuator 510 to attenuate RF signals over a large attenuation range (e.g., 0 to 30 dB attenuation) in fine attenuation steps (e.g., 1 dB steps). The fine attenuation may be used, for example, to finely optimize the signal path gain and SNR based on the received signal strength. Other features of the attenuator 510 are discussed further below.

Figure 6:
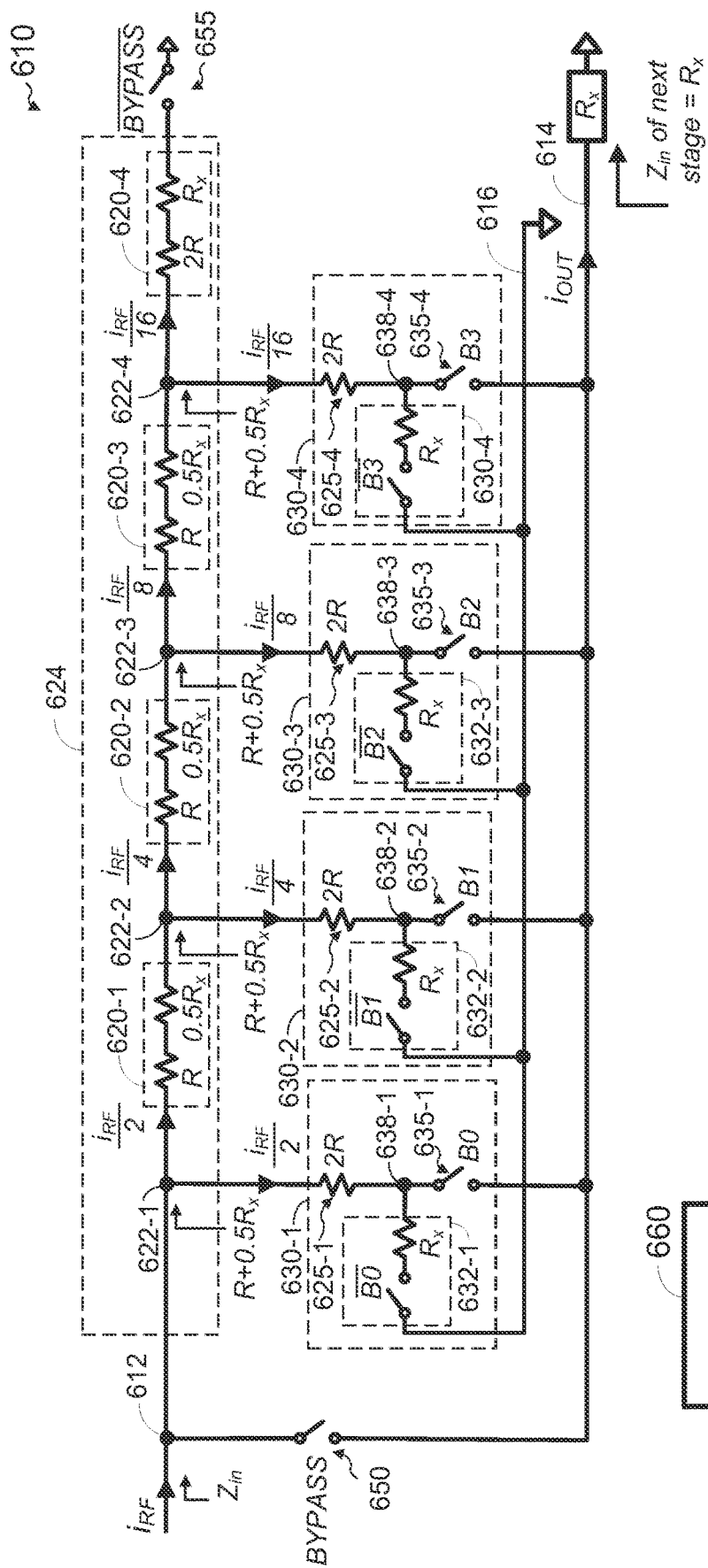
FIG. 6 shows an example of a coarse attenuator according to certain aspects of the present disclosure.

FIG. 6 shows an exemplary coarse attenuator 610 according to certain aspects. The coarse attenuator 610 may be used to implement the coarse attenuator 520 (i.e., the coarse attenuator 520 may include one or more instances of the coarse attenuator 610). In certain aspects, the coarse attenuator 610 is a current-mode attenuator based on an R-2R ladder, as discussed further below.

The coarse attenuator 610 has an input 612 and an output 614. The input 612 may be coupled to an antenna (e.g., antenna 115) via a transmission line (not shown). As discussed further below, the coarse attenuator 610 maintains an approximately constant input impedance at the input 612 (e.g., to provide impedance matching with the antenna and/or transmission line). The output 614 of the coarse attenuator 610 is coupled to a subsequent stage (not shown in FIG. 6) having an input impedance of $R_x$. For the example where the coarse attenuator 610 is cascaded with a fine attenuator (e.g., fine attenuator 530), the subsequent stage is the fine attenuator. However, it is to be understood that the coarse attenuator 610 is not limited to this example. In another example, the coarse attenuator 610 may be used as a standalone attenuator without a fine attenuator (e.g., for applications where the attenuation steps of the coarse attenuator 610 provide suitable granularity for adjusting attenuation of a signal). In this example, the subsequent stage may include an LNA (e.g., LNA 130), a mixer (e.g., mixer 135), a matching network (e.g., matching network 125), or any other circuit coupled to the output 614.

In certain aspects, the coarse attenuator 610 is configured to attenuate the signal at the input 612 via current splitting and current redirection, as discussed further below. The attenuation of the coarse attenuator 610 may be defined by the ratio $i_{OUT}/i_{RF}$, where $i_{OUT}$ is the current flowing out of the output 614 of the coarse attenuator 610 and $i_{RF}$ is the current flowing into the input 612 of the coarse attenuator 610. The attenuation may also be given in dB by computing $20*LOG_{10}(i_{OUT}/i_{RF})$. In certain aspects, the coarse attenuator 610 is configured to attenuate the signal at the input 612 in attenuation steps of 6 dB, as discussed further below.

In the example in FIG. 6, the coarse attenuator 610 includes a first bypass switch 650, a second bypass switch 655, resistors 620-1 to 620-4, and shunt circuits 630-1 to 630-4. The first bypass switch 650 is coupled between the input 612 and the output 614 of the coarse attenuator 610. The resistors 620-1 to 620-4 are coupled in series along a resistive path 624 between the input 612 and the second bypass switch 655, and the second bypass switch 655 is coupled between the resistor 620-4 and ground. The first bypass switch 650 and the second bypass switch 655 are driven by a bypass control signal (labeled "BYPASS") and the complement of the bypass control signal (labeled "$\overline{BYPASS}$"), respectively. In the present disclosure, an overbar is used to indicate a complement.

Each of the resistors 620-1 to 620-4 may be implemented with one resistor or multiple resistors coupled in series and/or parallel. Also, each of the resistors 620-1 to 620-4 may be implemented with one or more passive resistors, one or more active resistors (e.g., one or more transistors (e.g., metal-oxide-semiconductor (MOS) switches), etc.), or any combination thereof. For a resistor implemented with a MOS switch, the resistance of the resistor may correspond to the on-resistance of the MOS switch where the on-resistance is the resistance of the MOS switch when the MOS switch is turned on. In the example in FIG. 6, each of the resistors 620-1 to 620-3 has a resistance equal to $R+0.5R_x$, where $R_x$ is the input impedance of the subsequent stage coupled to the output 614 of the coarse attenuator 610. The last resistor 620-4 (also referred to as the termination resistor) has a resistance of $2R+R_x$ (i.e., twice the resistance of each of the resistors 620-1 to 620-3). As discussed further below, the resistance R affects the input impedance of the coarse attenuator 610 and may be chosen, for example, based on a desired input impedance for the coarse attenuator 610.

Each of the shunt circuits 630-1 to 630-4 is coupled to a respective node 622-1 to 622-4 on the resistive path 624. In certain aspects, the current flowing into each of the nodes 622-1 to 622-4 is evenly split between the respective shunt circuit 630-1 to 630-4 and the succeeding (i.e., following) resistor 620-1 to 620-4 in the resistive path 624. The even current splitting at each node 622-1 to 622-4 provides the coarse attenuator 610 with attenuation steps of 6 dB, as discussed further below.

In the example in FIG. 6, each of the shunt circuits 630-1 to 630-4 includes a respective shunt resistor 625-1 to 625-4, a respective shunt switch 635-1 to 635-4, and a respective switchable resistor circuit 632-1 to 632-4. As used herein, a "switchable resistor circuit" is a circuit that provides a resistive path when turned on and an open circuit (i.e., very high resistance) when turned off, in which the on/off state of the circuit may be controlled by a control signal (e.g., control bit), as discussed further below. A switchable resistor circuit may be implemented with a switch and a resistor (e.g., passive resistor) coupled in series, a switch, etc. For an implementation including a switch, the switch may be configured to have an on-resistance that contributes to the resistance of the switchable resistor circuit. Also, for an implementation including a switch, the switch is turned on when the switchable resistor circuit is turned on and the switch is turned off when the switchable resistor circuit is turned off.

In each shunt circuit 630-1 to 630-4, the respective shunt resistor 625-1 to 625-4 and the respective shunt switch 635-1 to 635-4 are coupled in series between the respective node 622-1 to 622-4 and the output 614 of the coarse attenuator 610. In the example in FIG. 6, each of the shunt resistors 625-1 to 625-4 has a resistance of 2R. As shown in FIG. 6, each of the shunt switches 635-1 to 635-4 is controlled by a respective control signal B0 to B3 (e.g., control bit). As discussed further below, each shunt circuit 630-1 to 630-4 directs (i.e., routes) the respective current to the output 614 of the coarse attenuator 610 when the respective shunt switch 635-1 to 635-4 is closed (i.e., turned on) by the respective control signal B0 to B3. Thus, each of the shunt switches 635-1 to 635-4 controls whether the respective current is routed to the output 614 of the coarse attenuator 610.

Each of the switchable resistor circuits 632-1 to 632-4 is coupled between a respective node 638-1 to 638-4 in the respective shunt circuit 630-1 to 630-4 and a reroute line 616, in which the respective node 638-1 to 638-4 is located between the respective shunt resistor 625-1 to 625-4 and the respective shunt switch 635-1 to 635-4. The reroute line 616 may be coupled to ground (as shown in the example in FIG. 6), a common-mode node, a floating node, etc. As discussed further below, the reroute line 616 is used to route (i.e., direct) current in the shunt circuits 630-1 to 630-4 away from the output 614 of the coarse attenuator 610 to attenuate the signal received at the input 612.

In the example in FIG. 6, each of the switchable resistor circuits 632-1 and 632-4 is controlled by the control signals $\overline{B0}$ to $\overline{B3}$, which are the complements of control signals B0 to B3. Each of the switchable resistor circuits 632-1 to 632-4 is either turned on or turned off by the respective one of the control signals $\overline{B0}$ to $\overline{B3}$. When a switchable resistor circuit 632-1 to 632-4 is turned on, the switchable resistor circuit 632-1 to 632-4 routes the current at the respective node 638-1 to 638-4 to the reroute line 616 through a resistance of $R_x$. When a switchable resistor circuit 632-1 to 632-4 is turned off, the switchable resistor circuit 632-1 to 632-4 provides an open circuit at the respective node 638-1 to 638-4. Thus, each of the switchable resistor circuits 632-1 to 632-4 controls whether the respective current is routed to the reroute line 616. As discussed further below, the attenuation level of the coarse attenuator 610 is controlled by controlling which one of the shunt circuits routes the respective current to the output 614 of the coarse attenuator 610.

Each of the switchable resistor circuits 632-1 to 632-4 may be implemented with a respective resistor and a respective switch coupled in series in some implementations. In these implementations, a switchable resistor circuit 632-1 to 632-4 is turned on by closing the respective switch and turned off by opening the respective switch using the respective one of the control signals $\overline{B0}$ to $\overline{B3}$. In other implementations, each of the switchable resistor circuits 632-1 to 632-4 may be implemented with a respective switch (e.g., MOS switch) having an on-resistance of approximately R.

In certain aspects, each of the shunt circuits 630-1 to 630-4 provides a resistance of $2R+R_x$ at the respective node 622-1 to 622-4 irrespective of whether the shunt circuit 630-1 to 630-4 routes the respective current to the output 614 of the coarse attenuator 610 or the reroute line 616. This helps ensure that the coarse attenuator 610 maintains the resistive properties of a R-2R ladder in which the resistance of each of the shunt circuits 630-1 to 630-3 is twice the resistance of the respective resistor 620-1 to 620-3 and the resistance of the last shunt circuit 630-4 is approximately equal to the resistance of the last resistor 620-4 in the resistive path 624 (also referred to as the termination resistor). For instance, when one of the shunt circuits 630-1 to 630-4 routes the respective current to the output 614 of the coarse attenuator 610, the resistance provided at the respective node 622-1 to 622-4 is equal to the sum of the resistance of the respective shunt resistor 625-1 to 625-4 (which is 2R in this example) and the input impedance of the subsequent stage coupled to the output 614 (which is $R_x$ in this example). When one of the shunt circuits 630-1 to 630-4 routes the respective current to the reroute line 616, the resistance provided at the respective node 622-1 to 622-4 is equal to the sum of the resistance of the respective shunt resistor 625-1 to 625-4 (which is 2R in this example) and the resistance of the respective switchable resistor circuit 632-1 to 632-4 (which is $R_x$ in this example). Thus, each of the shunt circuits 630-1 to 630-4 provides a resistance of $2R+R_x$ irrespective of whether the shunt circuit routes the respective current to the output 614 of the coarse attenuator 610 or the reroute line 616. This allows the coarse attenuator to maintain the resistive properties of an R-2R ladder irrespective of the attenuation level of the coarse attenuator 610. The resistive properties of the R-2R ladder causes the current entering each node 622-1 to 622-4 to be evenly split between the respective shunt circuit 630-1 to 630-4 and the succeeding (i.e., following) resistor 620-1 to 620-4, as discussed further below.

The resistive properties of an R-2R ladder also allow the coarse attenuator 610 to maintain an approximately constant input impedance of $R+0.5R_x$ irrespective of the attenuation level of the coarse attenuator 610. In one example, the input impedance of the subsequent stage coupled to the output 614 may be 50 ohms (i.e., $R_x$=50 ohms) and the desired input impedance of the attenuator 610 may be 50 ohms. In this example, the resistance R may be chosen to be approximately equal to 25 ohms to provide an input impedance of 50 ohms at the input 612. However, it is to be appreciated that the present disclosure is not limited to this example. For example, the coarse attenuator 610 may be configured to provide an input impedance of 50 ohms at the input 612 when the input impedance of the subsequent stage has an impedance other than 50 ohms by choosing the resistance R accordingly.

Exemplary operations of the coarse attenuator 610 will now be discussed according to certain aspects.

In certain aspects, a controller 660 controls the operation of the attenuator 610 using the bypass control signal BYPASS, the complement bypass control signal $\overline{\text{BYPASS}}$, the control signals B0 to B3, and the control signals $\overline{\text{B0}}$ to $\overline{\text{B3}}$. For ease of illustration, the individual connections between the controller 660 and the attenuator 610 are not explicitly shown in FIG. 6.

In certain aspects, the controller 660 operates the coarse attenuator 610 in a bypass mode or an attenuation mode. In the bypass mode, the controller 660 closes (i.e., turns on) the first bypass switch 650 and opens (i.e., turns off) the second bypass switch 655 using the bypass control signal BYPASS and the complement bypass control signal $\overline{\text{BYPASS}}$. In the bypass mode, the current at the input 612 flows to the output 614 through the first bypass switch 650. In this mode, the coarse attenuator 610 does not attenuate the RF signal at the input 612 assuming negligible losses between the input 612 and the output 614 through the first bypass switch 650. The bypass mode may be used, for example, when the RF signal at the input 612 has a lower signal strength and requires no attenuation.

In the attenuation mode, the controller 660 opens the first bypass switch 650 and closes the second bypass switch 655 using the bypass control signal BYPASS and the complement bypass control signal $\overline{\text{BYPASS}}$. In the attenuation mode, the controller 660 sets the attenuation level of the coarse attenuator 610 in attenuation steps of 6 dB by controlling which one of the shunt circuits 630-1 to 630-4 is used to route the respective current to the output 614 of the coarse attenuator 610. For the example where the resistors 620-1 to 620-4 are implemented with MOS switches or a combination of MOS switches and passive resistors, the MOS switches may be turned off in the bypass mode and turned on the attenuation mode. In this example, the second bypass switch 655 may be omitted.

For example, to provide an attenuation level of 6 dB, the controller 660 closes (i.e., turns on) the shunt switch 635-1 in the first shunt circuit 630-1 to route the respective current to the output 614 of the coarse attenuator 610 and turns on the switchable resistor circuits 632-2 to 632-4 in each of the remaining shunt circuits 630-2 to 630-4 to route the respective current to the reroute line 616. In this case, the node 622-1 splits the current $i_{RF}$ of the input RF signal evenly between the shunt circuit 630-1 and the resistor 620-1. Thus, the shunt circuit 630-1 receives the current $i_{RF}/2$, which the shunt circuit 630-1 directs (i.e., routes) to the output 614 of the coarse attenuator 610. As a result, the output current $i_{OUT}$ at the output 614 is approximately equal to $i_{RF}/2$, which corresponds to an attenuation level of 6 dB.

To provide an attenuation level of 12 dB, the controller 660 closes (i.e., turns on) the shunt switch 635-2 in the second shunt circuit 630-2 to route the respective current to the output 614 of the coarse attenuator 610 and turns on the switchable resistor circuit 632-1, 632-3, and 632-4 in each of the remaining shunt circuits 630-1, 630-3, and 630-4 to route the respective current to the reroute line 616. In this case, the node 622-2 receives the current $i_{RF}/2$ from the previous node 622-1 via the resistor 620-1. The node 622-2 evenly splits the current $i_{RF}/2$ between the second shunt circuit 630-2 and the second resistor 620-2. Thus, the second shunt circuit 630-2 receives the current $i_{RF}/4$, which the second shunt circuit 630-2 directs (i.e., routes) to the output 614 of the coarse attenuator 610. As a result, the output current $i_{OUT}$ at the output 614 is approximately equal to $i_{RF}/4$, which corresponds to an attenuation level of 12 dB.

To provide an attenuation level of 18 dB, the controller 660 closes (i.e., turns on) the shunt switch 635-3 in the third shunt circuit 630-3 to route the respective current to the output 614 of the coarse attenuator 610 and turns on the switchable resistor circuit 632-1, 632-2, and 632-4 in each of the remaining shunt circuits 630-1, 630-2, and 630-4 to route the respective current to the reroute line 616. In this case, the node 622-3 receives the current $i_{RF}/4$ from the previous node 622-2 via the resistor 620-2. The node 622-3 evenly splits the current $i_{RF}/4$ between the third shunt circuit 630-3 and the third resistor 620-3. Thus, the third shunt circuit 630-3 receives the current $i_{RF}/8$, which the third shunt circuit 630-3 directs (i.e., routes) to the output 614 of the coarse attenuator 610. As a result, the output current $i_{OUT}$ at the output 614 is approximately equal to $i_{RF}/8$, which corresponds to an attenuation level of 18 dB.

Finally, to provide an attenuation level of 24 dB, the controller 660 closes (i.e., turns on) the shunt switch 635-4 in the fourth shunt circuit 630-4 to route the respective current to the output 614 of the coarse attenuator 610 and turns on the switchable resistor circuits 632-1 to 632-3 in each of the remaining shunt circuits 630-1 to 630-3 to route the respective current to the reroute line 616. In this case, the node 622-4 receives the current $i_{RF}/8$ from the previous node 622-3 via the resistor 620-3. The node 622-4 evenly splits the current $i_{RF}/8$ between the fourth shunt circuit 630-4 and the last resistor 620-4 (also referred to as the terminal resistor). Thus, the fourth shunt circuit 630-4 receives the current $i_{RF}/16$, which the fourth shunt circuit 630-4 directs (i.e., routes) to the output 614 of the coarse attenuator 610. As a result, the output current $i_{OUT}$ at the output 614 is approximately equal to $i_{RF}/16$, which corresponds to an attenuation level of 24 dB.

Thus, in this example, the coarse attenuator 610 provides an attenuation level of 0 db in the bypass mode, and selectable attenuation levels of 6 dB, 12, dB, 18 dB, and 24 dB in the attenuation mode depending on which one of the shunt circuits 630-1 to 630-4 is selected by the controller 660 to route the respective current to the output 614 of the attenuator 610.

In one example, each of the shunt circuits 630-1 to 630-4 is configured to route the respective current to the output 614 of the coarse attenuator 610 when the respective one of the control signals B0 to B3 has a bit value of one (i.e., the respective shunt switch 635-1 to 635-4 is closed when the respective one of the control signals B0 to B3 has a bit value of one). Each of the shunt circuits 630-1 to 630-4 is configured to route the respective current to the reroute line 616 when the respective one of the control signals B0 to B3 has a bit value of zero (i.e., the respective switchable resistor circuit 632-1 to 632-4 is turned on when the respective one of the control signals B0 to B3 has a bit value of zero (i.e., the respective one of the control signals $\overline{B0}$ to $\overline{B3}$ has a bit value of one)). The table below provides the attenuation level of the coarse attenuator 610 as a function of the bit values of the control signals B0 to B3 in this example.

TABLE 1

| Attenuation (dB) | [B3 . . . B0] |
|---|---|
| 6 dB | 0001 |
| 12 dB | 0010 |
| 18 dB | 0100 |
| 24 dB | 1000 |

Since the coarse attenuator 610 is a current-mode attenuator, the coarse attenuator 610 does not suffer the rapid degradation in linearity with increases in attenuation level that hamper conventional voltage-mode attenuators such as the bridged-T attenuator 310 discussed above. In certain voltage-mode attenuators, the voltage drops across active devices (e.g., transistors) in the attenuator can become large as the attenuation level increases. The large voltage drops across the active devices cause the active devices to become non-linear which degrades the linearity of the attenuator. In contrast, because the coarse attenuator 610 achieves attenuation via current splitting and current redirection, increasing the attenuation level of the attenuator does not substantially increase voltage drops across the active devices in the attenuator, thereby avoiding the rapid degradation in linearity from which conventional voltage-mode attenuators suffer. In the coarse attenuator 610, increasing the attenuation level does not substantially change the voltage drops because the current entering the various nodes (e.g., 622-1 to 622-4) and the impedance at the various nodes (e.g., 622-1 to 622-4) do not change or change little with attenuation level.

Figure 7:
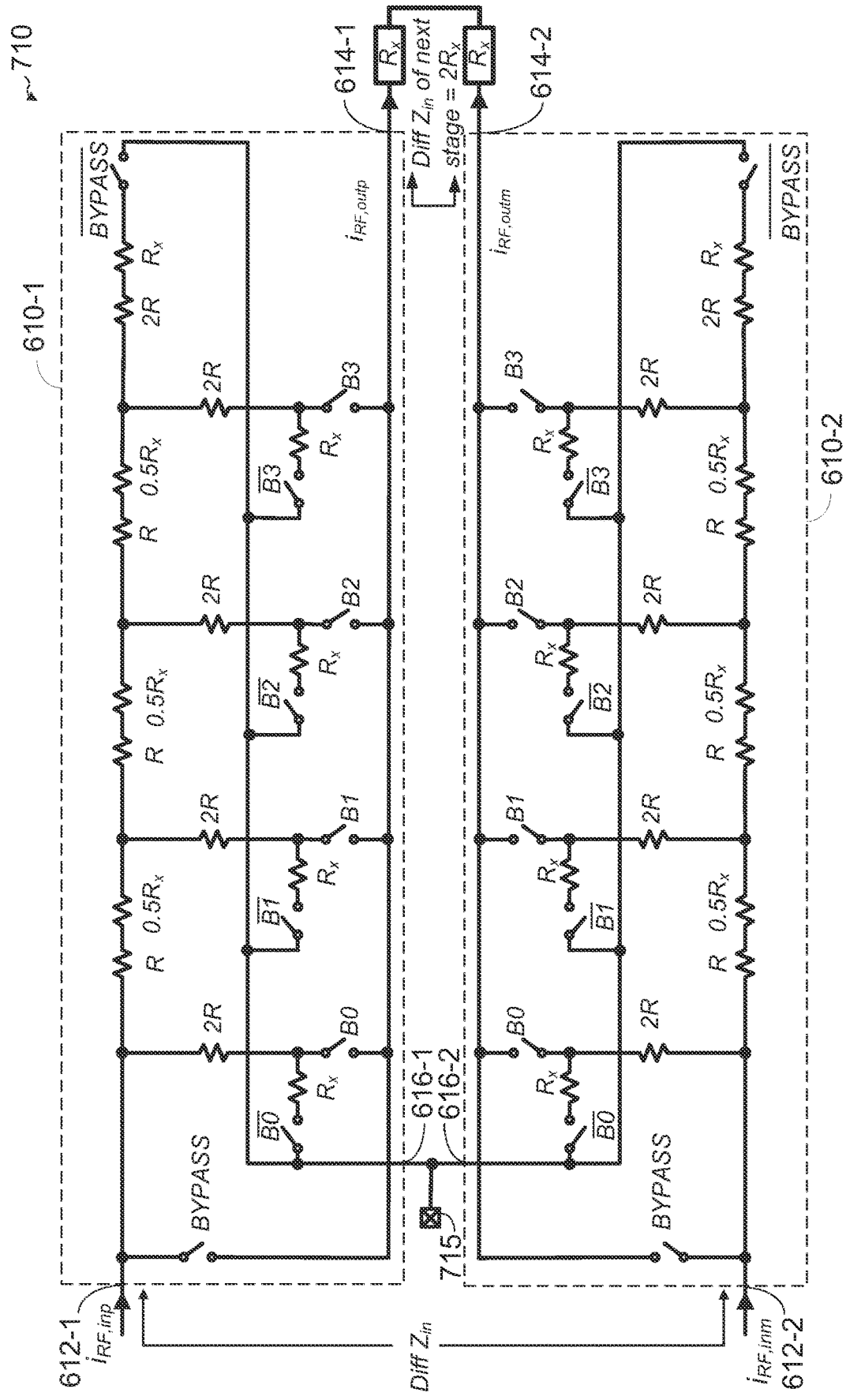
FIG. 7 shows an example of a differential coarse attenuator according to certain aspects of the present disclosure.

The exemplary coarse attenuator 610 shown in FIG. 6 is single ended. A differential coarse attenuator may be realized using two instances of the coarse attenuator 610. In this regard, FIG. 7 shows an example of a differential coarse attenuator 710 including a first coarse attenuator 610-1 and a second coarse attenuator 610-2. In this example, each of the first coarse attenuator 610-1 and the second coarse attenuator 610-2 is implemented with a separate instance of the coarse attenuator 610 discussed above with reference to FIG. 6. Thus, the description of the coarse attenuator 610 applies to each of the first coarse attenuator 610-1 and the second coarse attenuator 610-2.

In this example, the differential input of the subsequent stage is coupled between the output 614-1 of the first coarse attenuator 610-1 and the output 614-2 of the second coarse attenuator 610-2. The differential input of the differential coarse attenuator 710 includes the input 612-1 of the first coarse attenuator 610-1 and the input 612-2 of the second coarse attenuator 610-2. For example, the input 612-1 may be coupled to pin 112 and the input 612-2 may be coupled to pin 114 shown in FIGS. 1 and 2. The reroute line 616-1 of the first coarse attenuator 610-1 and the reroute line 616-2 of the second coarse attenuator 610-2 are coupled to a common-mode node 715, which may be coupled to a common-mode potential (i.e., voltage) of the differential input signal.

Figure 8:
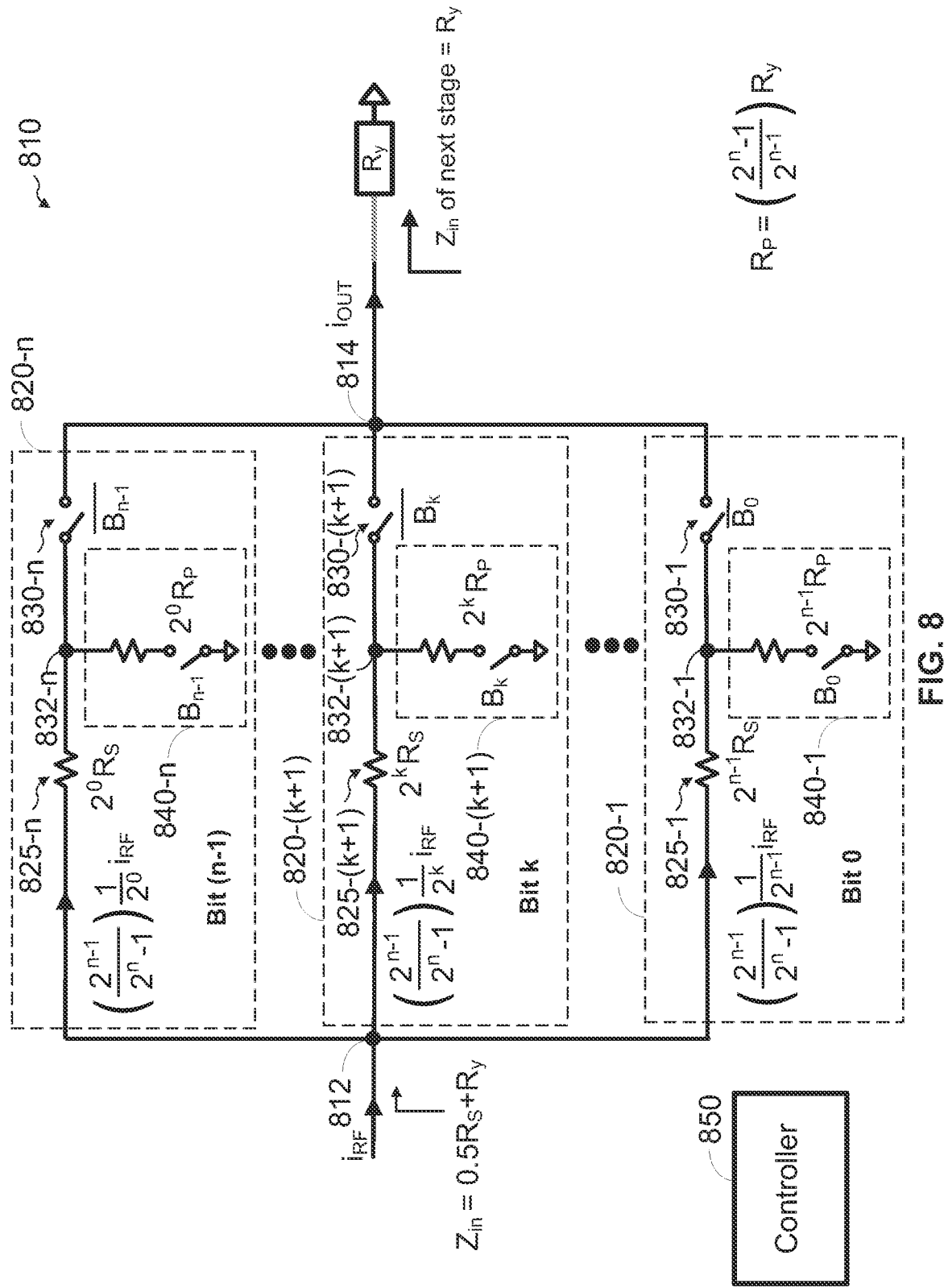
FIG. 8 shows an example of a fine attenuator according to certain aspects of the present disclosure.

FIG. 8 shows an exemplary fine attenuator 810 according to certain aspects. The fine attenuator 810 may be used to implement the fine attenuator 530 (i.e., the fine attenuator 530 may include one or more instances of the fine attenuator 810). In certain aspects, the fine attenuator 810 is a current-mode attenuator employing binary-weighted resistors, as discussed further below.

The fine attenuator 810 has an input 812 and an output 814. The input 812 may be coupled to a coarse attenuator (e.g., the output 614 of the coarse attenuator 610). However, it is to be understood that the fine attenuator 810 is not limited to this example. In another example, the fine attenuator 810 may be used as a standalone attenuator without a coarse attenuator. In this example, the input 812 of the fine attenuator 810 may be coupled to an antenna (e.g., antenna 115), a matching network, or any other circuit. As discussed further below, the fine attenuator 810 maintains an approximately constant input impedance at the input 812 (e.g., to provide impedance matching with the coarse attenuator 610 or another circuit coupled to the input 812).

The output 814 of the fine attenuator 810 is coupled to a subsequent stage (not shown in FIG. 8) having an input impedance of $R_y$. The subsequent stage may include a matching network (e.g., matching network 125), an LNA (e.g., LNA 130), a mixer (e.g., mixer 135), etc.

In this example, the fine attenuator 810 includes n routing circuits 820-1 to 820-n coupled in parallel between the input 812 and the output 814 of the fine attenuator 810. The current $i_{RF}$ entering the input 812 is split among the routing circuits 820-1 to 820-n, as discussed further below. Each of the routing circuits 820-1 to 820-n is configured to receive a respective control bit $B_0$ to $B_{n-1}$ from a controller 850. For ease of illustration, the individual connections between the controller 850 and the routing circuits 820-1 to 820-n are not explicitly shown in FIG. 8.

Each of the routing circuits 820-1 to 820-n is configured to either route the respective current to the output 814 of the fine attenuator 810 or route the respective current to ground or a common-mode node based on the bit value of the respective control bit $B_0$ to $B_{n-1}$. As discussed further below, the controller 850 controls the attenuation level of the fine attenuator 810 by controlling which ones of the routing circuits 820-1 to 820-$n$ route the respective current to the output 814 of the fine attenuator 810 and which ones of the routing circuits 820-1 to 820-$n$ route the respective current to ground or common-mode node using the control bits $B_0$ to $B_{n-1}$. In certain aspects, the control bits $B_0$ to $B_{n-1}$ support $2^n$ different combinations of n bit values corresponding to $2^n$ different attenuation levels. In some implementations, a subset of the $2^n$ different attenuation levels may be used (e.g., to provide attenuation steps of approximately 1 dB), as discussed further below.

In the example in FIG. 8, each of the routing circuits 820-1 to 820-$n$ includes a respective series resistor 825-1 to 825-$n$, a respective series switch 830-1 to 830-$n$, and a respective switchable resistor circuit 840-1 to 840-$n$. In each of the routing circuits 820-1 to 820-$n$, the respective series resistor 825-1 to 825-$n$ and the respective series switch 830-1 to 830-4 are coupled in series between the input 812 and the output 814 of the fine attenuator 810. As shown in FIG. 8, each of the series switches 830-1 to 830-$n$ is controlled by the respective one of the control bits $\overline{B_0}$ to $\overline{B_{n-1}}$, which are the complements of the control bits $B_0$ to $B_{n-1}$. As discussed further below, each routing circuit 820-1 to 820-$n$ directs (i.e., routes) the respective current to the output 814 of the fine attenuator 810 when the respective series switch 830-1 to 830-$n$ is closed by the respective control bit $\overline{B_0}$ to $\overline{B_{n-1}}$. Thus, each of the series switches 830-1 to 830-$n$ controls whether the respective current is routed to the output 814 of the fine attenuator 810.

The resistances of the series resistors 825-1 to 825-$n$ are binary-weighted resistances in which the resistances of the series resistors 825-1 to 825-$n$ differ from one another by different powers of two. As used herein, "binary-weighted" resistances are resistances that differ from one another by different powers of two. In the example shown in FIG. 8, the resistance of each of the series resistors 825-1 to 825-$n$ is equal to series resistance $R_S$ multiplied by a different power of two, as shown in FIG. 8. As a result, the input current $i_{RF}$ is split unevenly among the routing circuits 820-1 to 820-$n$. As discussed further below, the currents entering the routing circuits 820-1 to 820-$n$ are binary weighted due to the binary-weighted resistances of the routing circuits 820-1 to 820-$n$.

Each of the series resistors 825-1 to 825-$n$ may be implemented with one resistor or multiple resistors coupled in series and/or parallel. Also, each of the resistors 825-1 to 825-$n$ may be implemented with one or more passive resistors, one or more active resistors (e.g., one or more transistors (e.g., MOS switches), etc.), or any combination thereof.

Each of the switchable resistor circuits 840-1 to 840-$n$ is coupled between a respective node 832-1 to 832-$n$ in the respective routing circuit 820-1 to 820-$n$ and a ground or common-mode node (not shown in FIG. 8), in which the respective node 832-1 to 832-$n$ is located between the respective series resistor 825-1 to 825-$n$ and the respective series switch 830-1 to 830-$n$.

In the example in FIG. 8, each of the switchable resistor circuits 840-1 and 840-$n$ is controlled by the respective control bit $B_0$ to $B_{n-1}$. Each of the switchable resistor circuits 840-1 to 840-$n$ is either turned on or turned off by the respective control bit $B_0$ to $B_{n-1}$. When a switchable resistor circuit 840-1 to 840-$n$ is turned on, the switchable resistor circuit 840-1 to 840-$n$ routes the current at the respective node 832-1 to 832-$n$ to ground or common-mode node. When a switchable resistor circuit 840-1 to 840-$n$ is turned off, the switchable resistor circuit 840-1 to 840-$n$ provides an open circuit. In this case, the respective series switch 830-1 to 830-$n$ is closed (i.e., turned on) to route the respective current to the output 814 of the fine attenuator 810.

When a switchable resistor circuit 840-1 to 840-$n$ is turned on by the respective control bit, the switchable resistor circuit 840-1 to 840-$n$ has a respective resistance. In certain aspects, the resistances of the switchable resistor circuits 840-1 and 840-$n$ are binary-weighted resistances in which the resistances of the switchable resistor circuits 840-1 to 840-$n$ differ from one another by different powers of two. In the example shown in FIG. 8, the resistance of each of the switchable resistor circuits 840-1 to 840-$n$ is equal to resistance $R_P$ multiplied by a different power of two, where resistance $R_P$ is given by the following:

$$R_P = \left(\frac{2^n - 1}{2^{n-1}}\right) R_y \tag{1}$$

where n is the number of routing circuits 820-1 to 820-$n$, and $R_y$ is the impedance of the subsequent stage coupled to the output 814 of the fine attenuator 810.

Each of the switchable resistor circuits 840-1 to 840-$n$ may be implemented with a respective resistor and a respective switch coupled in series in some implementations. In these implementations, a switchable resistor circuit 840-1 to 840-$n$ is turned on by closing the respective switch and turned off by opening the respective switch using the respective control signal bit $B_0$ to $B_{n-1}$. In other implementations, each of the switchable resistor circuits 632-1 to 632-4 may be implemented with a respective switch (e.g., MOS switch) having an on-resistance.

As discussed above, the input current $i_{RF}$ is split unevenly among the routing circuits 820-1 to 820-$n$, in which the currents entering the routing circuits 820-1 to 820-$n$ are binary weighted. This is due to the binary weighted resistances of the routing circuits 820-1 to 820-$n$. In the example shown in FIG. 8, the routing circuit 820-1 (which has the largest resistance) has the lowest current, and the routing circuit 820-$n$ (which has the smallest resistance) has the largest current. The current entering the routing circuit 820-$n$ is $2^{n-1}$ times greater than the current entering the routing circuit 820-1.

As discussed above, the controller 850 controls the attenuation level of the fine attenuator 810 by controlling which ones of the routing circuits 820-1 to 820-$n$ route the respective current to the output 814 of the fine attenuator 810 and which ones of the routing circuits 820-1 to 820-$n$ route the respective current to ground or common-mode node using the control bits $B_0$ to $B_{n-1}$. In certain aspects, the bits $B_0$ to $B_{n-1}$ form a control code ($B_{n-1}$ ... $B_0$) that supports $2^n$ different values, where each of the values corresponds to a different attenuation level. For example, for a 5-bit implementation, the control code supports code values 0 to 31. The control bit $B_0$ is the least significant bit (LSB) and the control bit $B_{n-1}$ is the most significant bit (MSB) in the control code. In this example, the LSB $B_0$ controls the routing circuit 820-1 having the smallest current among the routing circuits 820-1 to 820-$n$, and the MSB $B_{n-1}$ controls the routing circuit 820-$n$ having the largest current among the routing circuits 820-1 to 820-$n$.

In certain aspects, the attenuation level of the fine attenuator 810 may be given as a function of the control code ($B_{n-1}$ ... $B_0$) as follows:

$$\frac{i_{OUT}}{i_{RF}} = \left(\frac{1}{2^n - 1}\right)\{2^{n-1}\overline{B_{n-1}} \ldots + 2^{n-k-1}\overline{B_k} \ldots + 2^0\overline{B_0}\}. \quad (2)$$

In the above example, a routing circuit 820-1 to 820-n routes the respective current to the output 814 (i.e., closes the respective series switch 830-1 to 830-n) when the respective control bit is zero (i.e., the complement of the respective control bit is one). However, it is to be appreciated that the present disclosure is not limited to this example. For implementations where a routing circuit 820-1 to 820-n routes the respective current to the output 814 (i.e., closes the respective series switch 830-1 to 830-n) when the respective control bit is one, the attenuation level may be given by:

$$\frac{i_{OUT}}{i_{RF}} = \left(\frac{1}{2^n - 1}\right)\{2^{n-1}B_{n-1} \ldots + 2^{n-k-1}B_k \ldots + 2^0 B_0\}. \quad (3)$$

In certain aspects, the controller 850 uses a subset of the available code values to adjust the attenuation level of the fine attenuator 810. For example, in a 5-bit implementation, the controller 850 may use the code values 3, 6, 11, 13, and 15 to implement attenuation steps of approximately 1 dB over a range of 0 to 6 dB. In another example, in a 6-bit implementation, the controller 850 may use the code values 7, 13, 18, 23, 27, and 31 to implement attenuation steps of approximately 1 dB over a range of 0 to 6 dB.

In cases where no attenuation is needed, the controller 850 may cause each one of the routing circuits 820-1 to 820-n to route the respective current to the output 814. In these cases, all of the current entering the input 812 of the coarse attenuator 810 is routed to the output 814 of the coarse attenuator 810 through the routing circuits 820-1 to 820-n, assuming negligible losses through the routing circuits 820-1 to 820-n.

In certain aspects, the fine attenuator 810 may maintain an approximately constant input impedance of 0.5 $R_S+R_y$ irrespective of the attenuation level of the fine attenuator 810. For a given input impedance $R_y$ of the subsequent stage at the output 814, the input impedance of the fine attenuator 810 may be configured to match the impedance of the preceding stage (e.g., coarse attenuator 610) by choosing the resistance $R_S$ accordingly.

In certain aspects, the routing circuits 820-1 and 820-n are implemented with modules, which facilitates a modular and a well-matched design. In these aspects, each of the routing circuit 820-1 to 820-n may be implemented with one or more modules coupled in parallel in which the number of modules coupled in parallel depends on the binary weight of the routing circuit, as discussed further below.

Figure 9A:
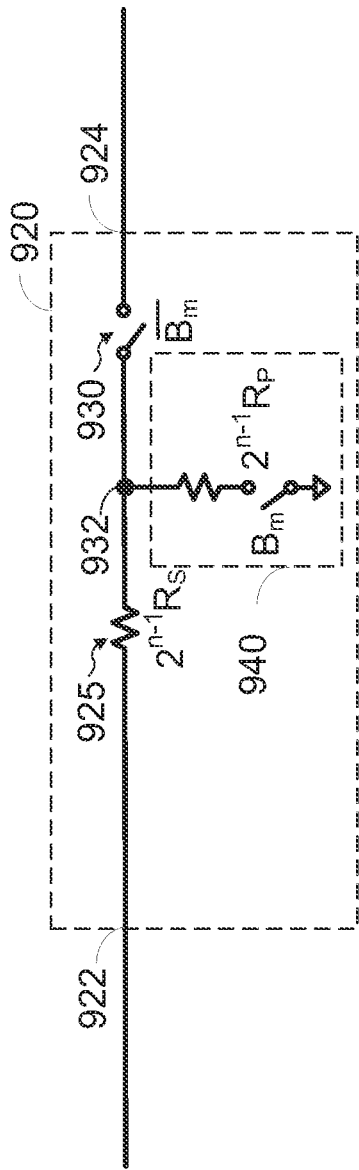
FIG. 9A shows an example of a module according to certain aspects of the present disclosure.

FIG. 9A shows an example of a module 920 according to certain aspects. The module 920 includes a series resistor 925 and a series switch 930 coupled in series between the input 922 and the output 924 of the module 920. The series resistor 925 has a resistance of $2^{n-1}R_S$. The series switch 930 is controlled by the control bit $\overline{B_m}$ where m can be any one of 0 to n−1.

The module 920 also includes a switchable resistor circuit 940 coupled between a node 932 and a ground or common-mode node (not shown in FIG. 9A), in which the node 932 is located between the series resistor 925 and the series switch 930. The switchable resistor circuit 940 is either turned on or turned off by the control bit $B_m$ where m can be any one of 0 to n−1. When the switchable resistor circuit 940 is turned on, the switchable resistor circuit 940 routes the current at the node 932 to ground or common-mode node with a resistance of $2^{n-1}R_P$. When the switchable resistor circuit 940 is turned off, the switchable resistor circuit 940 provides an open circuit. In this case, the series switch 930 is closed (i.e., turned on) to route the current at the node 932 to the output 924.

Figure 9B:
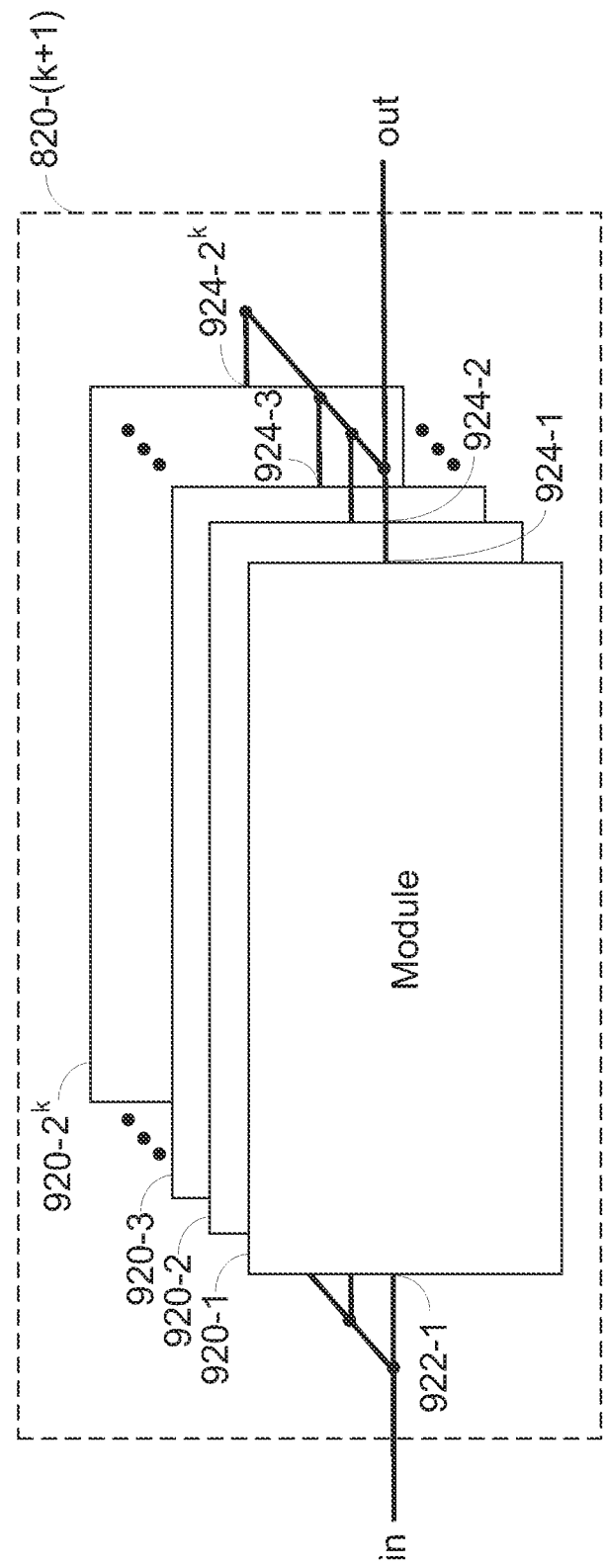
FIG. 9B shows an example of a routing circuit including multiple modules coupled in parallel according to certain aspects of the present disclosure.

In certain aspects, each of routing circuits 820-1 and 820-n may be implemented with one or more instances of the module 920 coupled in parallel in which the number of modules coupled in parallel depends on the binary weight of the routing circuit. In this regard, FIG. 9B shows an example in which the routing circuit 820-(k+1) in FIG. 8 is implemented with multiple modules 920-1 to 920-$2^k$ where each of the modules 920-1 to 920-$2^k$ is a separate instance of the module 920. In this example, the routing circuit 820-(k+1) includes 2k instances of the module 920. The series resistors of the modules 922-1 to 922-$2^k$ are controlled by the control bit $\overline{B_k}$ and the switchable resistor circuits of the modules 922-1 to 922-$2^k$ are controlled by control bit $B_k$ (i.e., the m in FIG. 9A corresponds to k in this example).

As shown in FIG. 9B, the modules 920-1 to 920-$2^k$ are coupled in parallel between the input (labeled "in") of the routing circuit 820-(k+1) and the output (labeled "out") of the routing circuit 820-(k+1). More particularly, the inputs 922-1 to 922-$2^k$ of the modules 920-1 to 920-$2^k$ are coupled to the input of the routing circuit 820-(k+1) and the outputs 924-1 to 924-$2^k$ of the modules 920-1 to 920-$2^k$ are coupled to the output of the routing circuit 820-(k+1).

In this example, the series resistor 825-(k+1) shown in FIG. 8 is implemented with the series resistors of the modules 920-1 to 920-$2^k$, the series switch 830-(k+1) shown in FIG. 8 is implemented with the series switches of the modules 920-1 to 920-$2^k$, and the switchable resistor circuit 840-(k+1) shown in FIG. 8 is implemented by the switchable resistor circuits of the modules 920-1 to 920-$2^k$.

In this example, the routing circuit 820-1 shown in FIG. 8 is implement with one instance of the module 920, in which the series switch is controlled by the control bit $\overline{B_0}$ and the switchable resistor circuit is controlled by the control bit $B_0$. The routing circuit 820-n is implemented with $2^{n-1}$ instances of the module 920 coupled in parallel, in which the series switches of the $2^{n-1}$ instances of the module 920 are controlled by the control bit $\overline{B_{n-1}}$ and the switchable resistor circuits of the $2^{n-1}$ instances of the module 920 are controlled by the control bit $B_{n-1}$.

Figure 10:
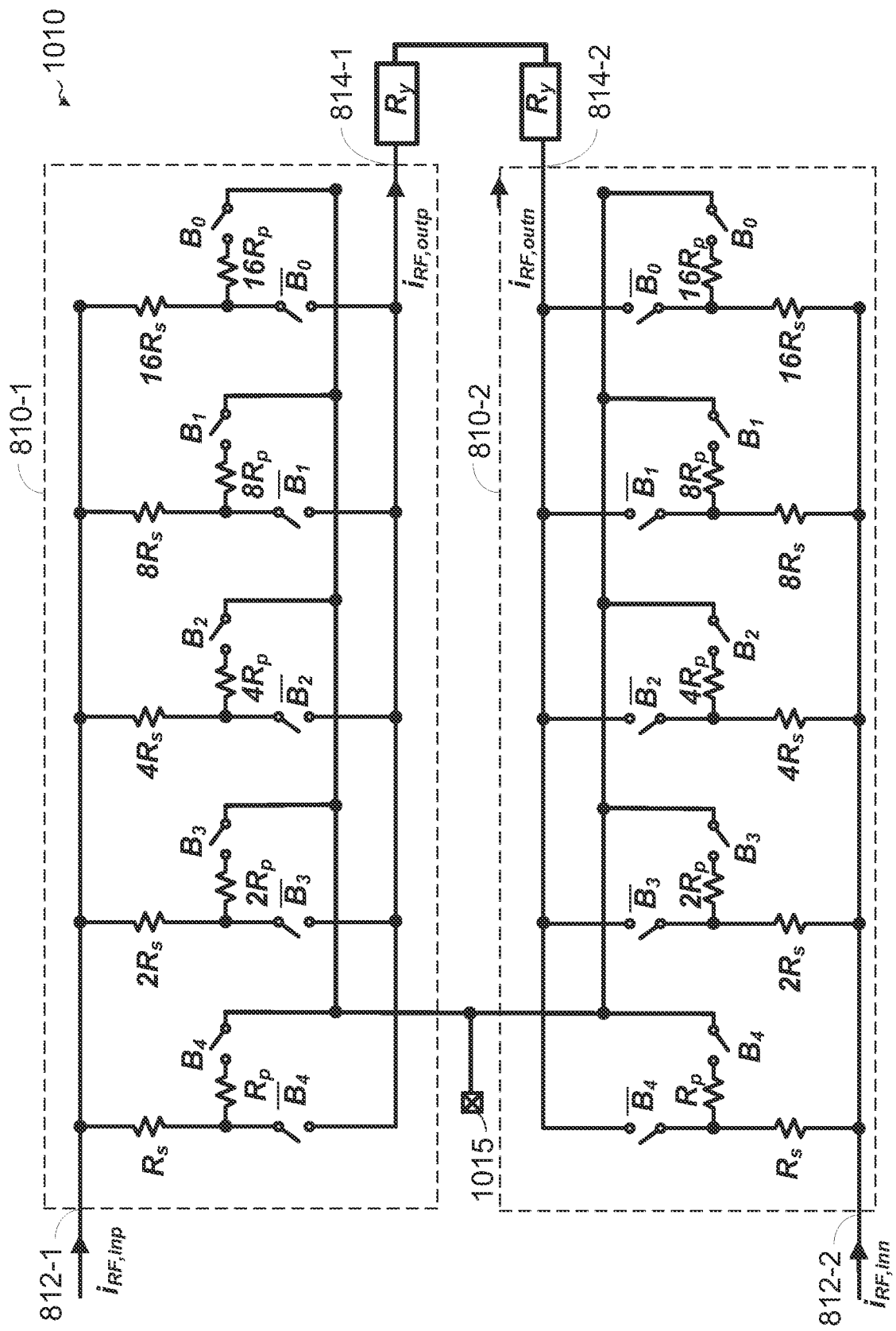
FIG. 10 shows an example of a differential fine attenuator according to certain aspects of the present disclosure.

The exemplary fine attenuator 810 shown in FIG. 8 is single ended. A differential fine attenuator may be realized using two instances of the fine attenuator 810. In this regard, FIG. 10 shows an example of a differential fine attenuator 1010 including a first fine attenuator 810-1 and a second fine attenuator 810-2. In this example, each of the first fine attenuator 810-1 and the second fine attenuator 810-2 is implemented with a separate instance of the fine attenuator 810 discussed above with reference to FIG. 8. In the example in FIG. 10, each of the first fine attenuator 810-1 and the second fine attenuator 810-2 is a 5-bit implementation of the fine attenuator 810. However, it is to be appreciated that the first fine attenuator 810-1 and the second fine attenuator 810-2 are not limited to this example.

In the example in FIG. 10, the differential input of the subsequent stage (e.g., the matching network 125, the LNA 130, the mixer 135, etc.) is coupled between the output 814-1 of the first fine attenuator 810-1 and the output 814-2 of the second fine attenuator 810-2. The differential input of the differential fine attenuator 1010 includes the input 812-1 of the first fine attenuator 810-1 and the input 812-2 of the second fine attenuator 810-2. For the example in which the differential coarse attenuator 710 is the previous stage, the input 810-1 may be coupled to the output 614-1 of the differential coarse attenuator 710 and the input 810-2 may be coupled to the output 614-2 of the differential coarse attenuator 710. The switchable resistor circuits of the first fine attenuator 810-1 and the switchable resistor circuits of the second fine attenuator 810 are coupled to a common-mode node 1015, which may be coupled to a common-mode potential (i.e., voltage) of the differential input signal.

Figure 11:
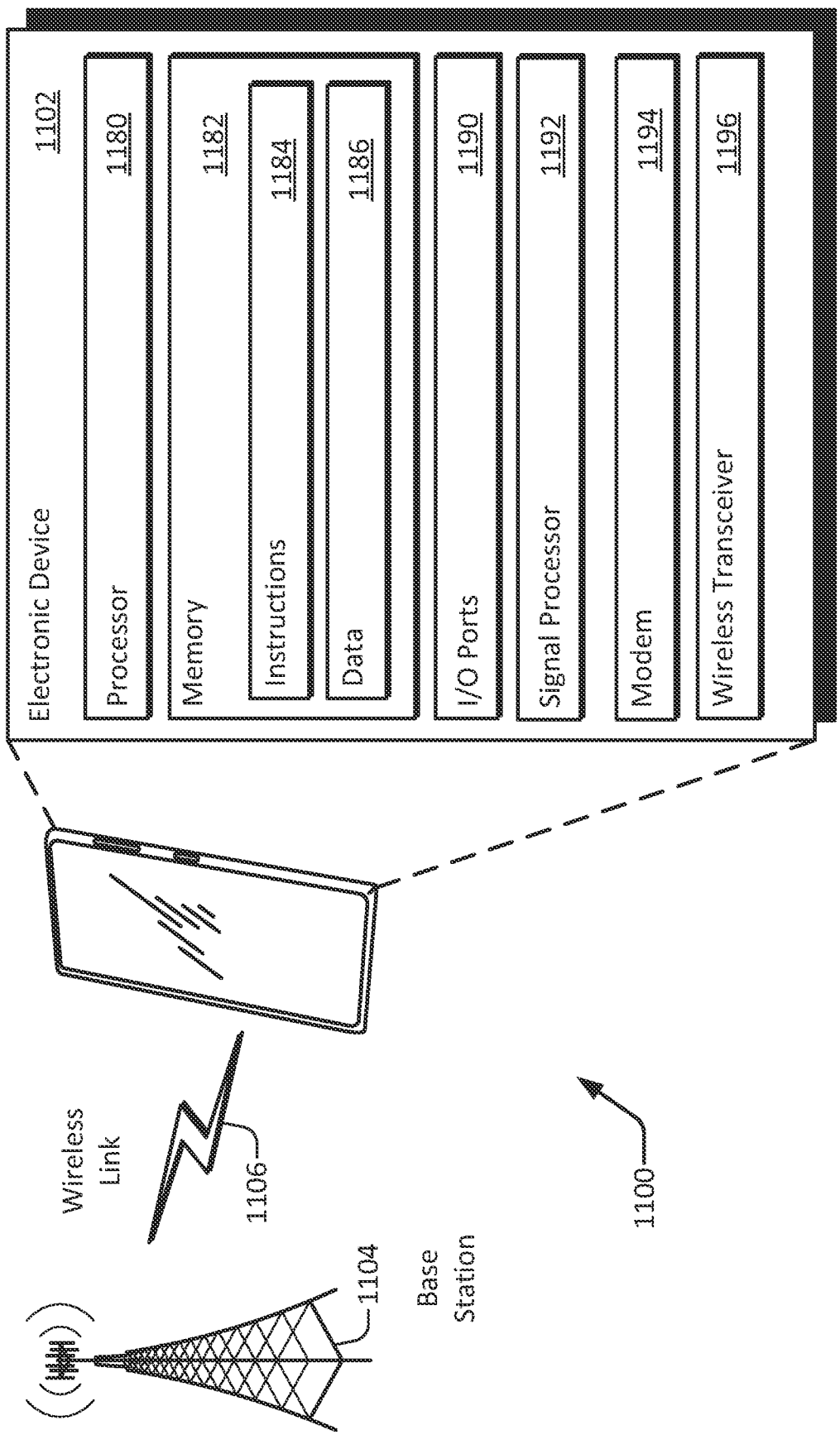
FIG. 11 is a diagram of an environment including an electronic device that includes a transceiver according to certain aspects of the present disclosure.

FIG. 11 is a diagram of an environment 1100 that includes an electronic device 1102 and a base station 1104. The electronic device 1102 includes a wireless transceiver 1196, which may include the receiver 110, the receiver 210, the attenuator 120, the matching network 125, the LNA 130, the mixer 135, the filter 140, and/or the ADC 150. The attenuator 120 may include any one or more of the attenuators 520, 530, 610, and 810.

In the environment 1100, the electronic device 1102 communicates with the base station 1104 via a wireless link 1106. As shown, the electronic device 1102 is depicted as a smart phone. However, the electronic device 1102 may be implemented as any suitable computing or other electronic device, such as a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, and so forth.

The base station 1104 communicates with the electronic device 1102 via the wireless link 1106, which may be implemented as any suitable type of wireless link. Although depicted as a base station tower of a cellular radio network, the base station 1104 may represent or be implemented as another device, such as a satellite, terrestrial broadcast tower, access point, peer to peer device, mesh network node, fiber optic line, another electronic device generally as described above, and so forth. Hence, the electronic device 1102 may communicate with the base station 1104 or another device via a wired connection, a wireless connection, or a combination thereof. The wireless link 1106 can include a downlink of data or control information communicated from the base station 1104 to the electronic device 1102 and an uplink of other data or control information communicated from the electronic device 1102 to the base station 1104. The wireless link 1106 may be implemented using any suitable communication protocol or standard, such as 3rd Generation Partnership Project Long-Term Evolution (3GPP LTE, 3GPP NR 5G), IEEE 1102.11, IEEE 1102.11, Bluetooth™, and so forth.

The electronic device 1102 includes a processor 1180 and a memory 1182. The memory 1182 may be or form a portion of a computer readable storage medium. The processor 1180 may include any type of processor, such as an application processor or a multi-core processor, that is configured to execute processor-executable instructions (e.g., code) stored in the memory 1182. The memory 1182 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the memory 1182 is implemented to store instructions 1184, data 1186, and other information of the electronic device 1102.

The electronic device 1102 may also include input/output (I/O) ports 1190. The I/O ports 1190 enable data exchanges or interaction with other devices, networks, or users or between components of the device.

The electronic device 1102 may further include a signal processor (SP) 1192 (e.g., such as a digital signal processor (DSP)). The signal processor 1192 may function similar to the processor 1180 and may be capable of executing instructions and/or processing information in conjunction with the memory 1182. The signal processor 1192 may include the baseband processor 160.

For communication purposes, the electronic device 1102 also includes a modem 1194, the wireless transceiver 1196, and one or more antennas (e.g., antenna 115). The wireless transceiver 1196 provides connectivity to respective networks and other electronic devices connected therewith using RF wireless signals. The wireless transceiver 1196 may facilitate communication over any suitable type of wireless network, such as a wireless local area network (LAN) (WLAN), a peer to peer (P2P) network, a mesh network, a cellular network, a wireless wide area network (WWAN), a navigational network (e.g., the Global Positioning System (GPS) of North America or another Global Navigation Satellite System (GNSS)), and/or a wireless personal area network (WPAN).

Implementation examples are described in the following numbered clauses:

1. An attenuator, comprising:
   resistors coupled along a resistive path, wherein a first one of the resistors is coupled to an input of the attenuator; and
   shunt circuits, wherein each one of the shunt circuits is coupled between a respective node on the resistive path and an output of the attenuator, and each one of the shunt circuits comprises:
      a respective shunt resistor and a respective shunt switch coupled in series between the respective node on the resistive path and the output of the attenuator; and
      a respective switchable resistor circuit coupled to a respective node between the respective shunt resistor and the respective shunt switch.

2. The attenuator of clause 1, wherein each one of the switchable resistor circuits is configured to provide a respective resistive path to a ground or a common-mode node when the switchable resistor circuit is turned on.

3. The attenuator of clause 2, wherein the respective resistive path of each one of the switchable resistor circuits has a resistance approximately equal to an input impedance of a stage coupled to the output of the attenuator.

4. The attenuator of clause 3, wherein the stage comprises at least one of another attenuator, a low-noise amplifier, a matching network, or a mixer.

5. The attenuator of any one of clauses 1 to 4, wherein:
   a last one of the resistors along the resistive path has a resistance approximately equal to $2R+R_X$, where $R_X$ is approximately equal to an input impedance of a stage coupled to the output of the attenuator; and
   each one of other ones of the resistors along the resistive path has a resistance approximately equal to $R+0.5R_X$.

6. The attenuator of clause 5, wherein the respective shunt resistor of each one of the shunt circuits has a resistance approximately equal to 2R.

7. The attenuator of clause 5 or 6, wherein the stage comprises at least one of another attenuator, a low-noise amplifier, a matching network, or a mixer.

8. The attenuator of any one of clauses 5 to 7, wherein each one of the switchable resistor circuits is configured to provide a respective resistive path to a ground or a common-mode node when the switchable resistor circuit is turned on, the respective resistive path having a resistance approximately equal to $R_X$.

9. The attenuator of any one of clauses 1 to 8, wherein the input of the attenuator is coupled to an antenna.

10. The attenuator of any one of clauses 1 to 9, further comprising a bypass switch coupled between the input of the attenuator and the output of the attenuator.

11. An attenuator, comprising:
routing circuits coupled in parallel between an input of the attenuator and an output of the attenuator, wherein each one of the routing circuits comprises:
a respective series resistor and a respective series switch coupled in series between the input of the attenuator and the output of the attenuator; and
a respective switchable resistor circuit coupled to a respective node between the respective series resistor and the respective series switch;
wherein resistances of the series resistors of the routing circuits are binary weighted.

12. The attenuator of clause 11, wherein each one of the switchable resistor circuits is configured to provide a respective resistive path to a ground or a common-mode node when the switchable resistor circuit is turned on.

13. The attenuator of clause 12, wherein resistances of the resistive paths of the switchable resistor circuits are binary weighted.

14. The attenuator of clause 12 or 13, wherein a resistance of the respective resistive path of each one of the switchable resistor circuits is approximately equal to $$\left(\frac{2^n-1}{2^{n-1}}\right)R_y$$

multiplied by a different power of two, wherein n is a number of the routing circuits and $R_y$ is approximately equal to an input impedance of a stage coupled to the output of the attenuator.

15. The attenuator of clause 14, wherein the stage comprises at least one of another attenuator, a low-noise amplifier, a matching network, or a mixer.

16. A system, comprising:
a first attenuator having an input and an output, the first attenuator comprising:
resistors coupled along a resistive path, wherein a first one of the resistors is coupled to the input of the first attenuator; and
shunt circuits, wherein each one of the shunt circuits is coupled between a respective node on the resistive path and the output of the first attenuator, and each one of the shunt circuits comprises:
a respective shunt resistor and a respective shunt switch coupled in series between the respective node on the resistive path and the output of the first attenuator; and
a respective switchable resistor circuit coupled to a respective node between the respective shunt resistor and the respective shunt switch; and
a second attenuator having an input and an output, wherein the input of the second attenuator is coupled to the output of the first attenuator.

17. The system of clause 16, wherein each one of the switchable resistor circuits of the first attenuator is configured to provide a respective resistive path to a ground or a common-mode node when the switchable resistor circuit is turned on.

18. The system of clause 17, wherein the respective resistive path of each one of the switchable resistor circuits of the first attenuator has a resistance approximately equal to an input impedance of the second attenuator.

19. The system of any one of clauses 16 to 18, wherein:
a last one of the resistors along the resistive path has a resistance approximately equal to $2R+R_X$, where $R_X$ is approximately equal to an input impedance of the second attenuator; and
each one of other ones of the resistors along the resistive path has a resistance approximately equal to $R+0.5R_X$.

20. The system of clause 19, wherein the respective shunt resistor of each one of the shunt circuits has a resistance approximately equal to 2R.

21. The system of any one of clauses 16 to 20, further comprising an antenna coupled to the input of the first attenuator.

22. The system of clause 21, wherein the output of the second attenuator is coupled to at least one of a low-noise amplifier, a matching network, or a mixer.

23. The system of any one of clauses 16 to 22, wherein the second attenuator comprises:
routing circuits coupled in parallel between the input of the second attenuator and the output of the second attenuator, wherein each one of the routing circuits comprises:
a respective series resistor and a respective series switch coupled in series between the input of the second attenuator and the output of the second attenuator; and
a respective switchable resistor circuit coupled to a respective node between the respective series resistor and the respective series switch;
wherein resistances of the series resistors of the routing circuits are binary weighted.

24. The system of clause 23, wherein each one of the switchable resistor circuits of the second attenuator is configured to provide a respective resistive path to a ground or a common-mode node when the switchable resistor circuit is turned on.

25. The system of clause 24, wherein resistances of the resistive paths of the switchable resistor circuits of the second attenuator are binary weighted.

26. A system comprising:
a first attenuator having an input and an output, the first attenuator comprising:
resistors coupled along a resistive path, wherein a first one of the resistors is coupled to the input of the first attenuator; and
shunt circuits, wherein each one of the shunt circuits is coupled between a respective node on the resistive path and the output of the first attenuator, and each one of the shunt circuits comprises:
a respective shunt resistor and a respective shunt switch coupled in series between the respective node on the resistive path and the output of the first attenuator; and
a respective switchable resistor circuit coupled to a respective node between the respective shunt resistor and the respective shunt switch; and a second attenuator having an input and an output, the second attenuator comprising:
  routing circuits coupled in parallel between the input of the second attenuator and the output of the second attenuator, wherein each one of the routing circuits comprises:
    a respective series resistor and a respective series switch coupled in series between the input of the second attenuator and the output of the second attenuator; and
    a respective switchable resistor circuit coupled to a respective node between the respective series resistor and the respective series switch;
  wherein resistances of the series resistors of the routing circuits are binary weighted.

27. The system of clause 26, wherein each one of the switchable resistor circuits of the first attenuator is configured to provide a respective resistive path to a ground or a common-mode node when the switchable resistor circuit is turned on.

28. The system of clause 27, wherein the respective resistive path of each one of the switchable resistor circuits of the first attenuator has a resistance approximately equal to an input impedance of the second attenuator.

29. The system of any one of clauses 26 to 28, wherein:
  a last one of the resistors along the resistive path has a resistance approximately equal to $2R+R_X$, where $R_X$ is approximately equal to an input impedance of the second attenuator; and
  each one of other ones of the resistors along the resistive path has a resistance approximately equal to $R+0.5R_X$.

30. The system of clause 29, wherein the respective shunt resistor of each one of the shunt circuits has a resistance approximately equal to 2R.

31. The system of clause 30, wherein each one of the switchable resistor circuits of the first attenuator is configured to provide a respective resistive path to a ground or a common-mode node when the switchable resistor circuit is turned on, the respective resistive path having a resistance approximately equal to $R_X$.

32. The system of any one of clauses 26 to 31, wherein the input of the first attenuator is coupled to an antenna.

33. The system of any one of clauses 26 to 32, further comprising a bypass switch coupled between the input of the first attenuator and the output of the first attenuator.

34. The system of any one of clauses 26 to 33, wherein each one of the switchable resistor circuits of the second attenuator is configured to provide a respective resistive path to a ground or a common-mode node when the switchable resistor circuit is turned on.

35. The system of clause 34, wherein resistances of the resistive paths of the switchable resistor circuits of the second attenuator are binary weighted.

36. The system of clause 34 or 35, wherein a resistance of the respective resistive path of each one of the switchable resistor circuits of the second attenuator is approximately equal to $$\left(\frac{2^n-1}{2^{n-1}}\right)R_y$$

multiplied by a different power of two, wherein n is a number of the routing circuits and $R_y$ is approximately equal to an input impedance of a stage coupled to the output of the second attenuator.

37. The system of clause 36, wherein the stage comprises at least one of a low-noise amplifier, a matching network, or a mixer.

It is to be appreciated that the present disclosure is not limited to the exemplary terminology used above to describe aspects of the present disclosure. For example, a MOS switch may also be referred to as a metal-oxide-semiconductor field effect transistor (MOSFET) switch, a transistor switch, or another term. The subsequent stage may also be referred to as the next stage, the following stage, or another term. A stage may also be referred to as a circuit, a block, a device, or another term. A control code may also be referred to as a digital code, a control word, or another term.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property and/or within typical manufacturing and design tolerances. For example, the resistance $R_X$ being approximately equal to an input impedance of a stage coupled to the output of an attenuator (e.g., attenuator 610 or 810) indicates that the resistance $R_X$ is within 90% to 110% of the input impedance of the stage.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel feature disclosed herein.

What is claimed is:

1. An attenuator, comprising:
  resistors coupled along a resistive path, wherein a first one of the resistors is coupled to an input of the attenuator; and
  shunt circuits, wherein each one of the shunt circuits is coupled between a respective node on the resistive path and an output of the attenuator, and each one of the shunt circuits comprises:
    a respective shunt resistor and a respective shunt switch coupled in series between the respective node on the resistive path and the output of the attenuator; and
    a respective switchable resistor circuit coupled to a respective node between the respective shunt resistor and the respective shunt switch.

2. The attenuator of claim 1, wherein each one of the switchable resistor circuits is configured to provide a respective resistive path to a ground or a common-mode node when the switchable resistor circuit is turned on.

3. The attenuator of claim 2, wherein the respective resistive path of each one of the switchable resistor circuits has a resistance approximately equal to an input impedance of a stage coupled to the output of the attenuator.

4. The attenuator of claim 3, wherein the stage comprises at least one of another attenuator, a low-noise amplifier, a matching network, or a mixer.

5. The attenuator of claim 1, wherein:
a last one of the resistors along the resistive path has a resistance approximately equal to $2R+R_X$, where $R_X$ is approximately equal to an input impedance of a stage coupled to the output of the attenuator; and
each one of other ones of the resistors along the resistive path has a resistance approximately equal to $R+0.5R_X$.

6. The attenuator of claim 5, wherein the respective shunt resistor of each one of the shunt circuits has a resistance approximately equal to 2R.

7. The attenuator of claim 5, wherein the stage comprises at least one of another attenuator, a low-noise amplifier, a matching network, or a mixer.

8. The attenuator of claim 5, wherein each one of the switchable resistor circuits is configured to provide a respective resistive path to a ground or a common-mode node when the switchable resistor circuit is turned on, the respective resistive path having a resistance approximately equal to $R_X$.

9. The attenuator of claim 1, wherein the input of the attenuator is coupled to an antenna.

10. The attenuator of claim 1, further comprising a bypass switch coupled between the input of the attenuator and the output of the attenuator.

11. An attenuator, comprising:
routing circuits coupled in parallel between an input of the attenuator and an output of the attenuator, wherein each one of the routing circuits comprises:
a respective series resistor and a respective series switch coupled in series between the input of the attenuator and the output of the attenuator; and
a respective switchable resistor circuit coupled to a respective node between the respective series resistor and the respective series switch; wherein resistances of the series resistors of the routing circuits are binary weighted.

12. The attenuator of claim 11, wherein each one of the switchable resistor circuits is configured to provide a respective resistive path to a ground or a common-mode node when the switchable resistor circuit is turned on.

13. The attenuator of claim 12, wherein resistances of the resistive paths of the switchable resistor circuits are binary weighted.

14. The attenuator of claim 12, wherein a resistance of the respective resistive path of each one of the switchable resistor circuits is approximately equal to $$\left(\frac{2^n-1}{2^{n-1}}\right)R_y$$

multiplied by a different power of two, wherein n is a number of the routing circuits and $R_y$ is approximately equal to an input impedance of a stage coupled to the output of the attenuator.

15. The attenuator of claim 14, wherein the stage comprises at least one of another attenuator, a low-noise amplifier, a matching network, or a mixer.

16. A system, comprising:
a first attenuator having an input and an output, the first attenuator comprising:
resistors coupled along a resistive path, wherein a first one of the resistors is coupled to the input of the first attenuator; and
shunt circuits, wherein each one of the shunt circuits is coupled between a respective node on the resistive path and the output of the first attenuator, and each one of the shunt circuits comprises:
a respective shunt resistor and a respective shunt switch coupled in series between the respective node on the resistive path and the output of the first attenuator; and
a respective switchable resistor circuit coupled to a respective node between the respective shunt resistor and the respective shunt switch; and
a second attenuator having an input and an output, wherein the input of the second attenuator is coupled to the output of the first attenuator.

17. The system of claim 16, wherein each one of the switchable resistor circuits of the first attenuator is configured to provide a respective resistive path to a ground or a common-mode node when the switchable resistor circuit is turned on.

18. The system of claim 17, wherein the respective resistive path of each one of the switchable resistor circuits of the first attenuator has a resistance approximately equal to an input impedance of the second attenuator.

19. The system of claim 16, wherein:
a last one of the resistors along the resistive path has a resistance approximately equal to $2R+R_X$, where $R_X$ is approximately equal to an input impedance of the second attenuator; and
each one of other ones of the resistors along the resistive path has a resistance approximately equal to $R+0.5R_X$.

20. The system of claim 19, wherein the respective shunt resistor of each one of the shunt circuits has a resistance approximately equal to 2R.

21. The system of claim 16, further comprising an antenna coupled to the input of the first attenuator.

22. The system of claim 21, wherein the output of the second attenuator is coupled to at least one of a low-noise amplifier, a matching network, or a mixer.

23. The system of claim 16, wherein the second attenuator comprises:
routing circuits coupled in parallel between the input of the second attenuator and the output of the second attenuator, wherein each one of the routing circuits comprises:
a respective series resistor and a respective series switch coupled in series between the input of the second attenuator and the output of the second attenuator; and
a respective switchable resistor circuit coupled to a respective node between the respective series resistor and the respective series switch; wherein resistances of the series resistors of the routing circuits are binary weighted.

24. The system of claim 23, wherein each one of the switchable resistor circuits of the second attenuator is configured to provide a respective resistive path to a ground or a common-mode node when the switchable resistor circuit is turned on.

25. The system of claim 24, wherein resistances of the resistive paths of the switchable resistor circuits of the second attenuator are binary weighted.

* * * * *